United States Patent
Feng et al.

(10) Patent No.: US 11,244,619 B2
(45) Date of Patent: Feb. 8, 2022

(54) SHIFT REGISTER UNIT, GATE DRIVING CIRCUIT, DISPLAY DEVICE AND DRIVING METHOD

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/643,280

(22) PCT Filed: Mar. 1, 2019

(86) PCT No.: PCT/CN2019/076745
§ 371 (c)(1),
(2) Date: Feb. 28, 2020

(87) PCT Pub. No.: WO2020/177029
PCT Pub. Date: Sep. 10, 2020

(65) Prior Publication Data
US 2021/0210017 A1   Jul. 8, 2021

(51) Int. Cl.
*G09G 3/36* (2006.01)
*G09G 5/00* (2006.01)
*G09G 3/3258* (2016.01)
*G11C 19/28* (2006.01)

(52) U.S. Cl.
CPC ......... *G09G 3/3258* (2013.01); *G11C 19/287* (2013.01); *G09G 2310/0286* (2013.01); *G09G 2310/08* (2013.01)

(58) Field of Classification Search
CPC ..... G09G 2310/0283; G09G 2310/061; G09G 2320/0295; G09G 2330/08; G09G 3/3225;
(Continued)

(56) References Cited

U.S. PATENT DOCUMENTS

2017/0039950 A1* 2/2017 Li ..................... G09G 3/3266
2018/0149889 A1* 5/2018 Kim .................. G09G 3/22
(Continued)

FOREIGN PATENT DOCUMENTS

CN 108648716 A 10/2018
CN 108711401 A 10/2018
(Continued)

OTHER PUBLICATIONS

PCT International Search Report, Application No. PCT/CN2019/076745, dated Nov. 29, 2019, 7 pages: with English translation.
(Continued)

*Primary Examiner* — Pegeman Karimi
(74) *Attorney, Agent, or Firm* — Armstrong Teasdale LLP

(57) ABSTRACT

A shift register unit, a gate driving circuit, a display device and a driving method. The shift register unit includes a blank input circuit, a blank pull-up circuit, a display input circuit, and an output circuit. The blank input circuit charges and holds the level of the pull-up control node, the blank pull-up circuit uses a first clock signal to charge a pull-up node, the display input circuit charges the pull-up node, and the output circuit outputs a plurality of output clock signals respectively to a plurality of output terminals. The plurality of output terminals include a shift signal output terminal and a plurality of pixel signal output terminals. The plurality of pixel signal output terminals are configured to respectively output a plurality of pixel signals to a plurality of rows of pixel units.

20 Claims, 15 Drawing Sheets

(58) Field of Classification Search
CPC .. G09G 3/3648; G09G 3/3674; G09G 3/3677; G09G 2310/0286; G09G 3/3266; G09G 2310/08; G09G 2300/0465; G09G 2310/0267; G09G 3/32; G09G 3/3258; G09G 5/00; G09G 3/10; G11C 19/28; G11C 19/287; G06F 3/038
See application file for complete search history.

(56) References Cited

U.S. PATENT DOCUMENTS

2018/0337682 A1* 11/2018 Takasugi .............. G09G 3/3266
2018/0366067 A1* 12/2018 Jang .................... G09G 3/3674

FOREIGN PATENT DOCUMENTS

| | | |
|---|---|---|
| CN | 108806611 A | 11/2018 |
| CN | 109166527 A | 1/2019 |
| CN | 109935209 A | 6/2019 |
| TW | 201445532 A | 12/2014 |
| WO | 2006123770 A1 | 11/2006 |
| WO | 2016095300 A1 | 6/2016 |

OTHER PUBLICATIONS

PCT Written Opinion, Application No. PCT/CN2019/076745, dated Nov. 29, 2019, 6 pages.: with English translation of relevant part.
China First Office Action, Application No. 201980000223.9, dated Jun. 21, 2021, 46 pps.: with English translation.

\* cited by examiner

SHIFT REGISTER UNIT, GATE DRIVING CIRCUIT, DISPLAY DEVICE AND DRIVING METHOD

CROSS REFERENCE TO RELATED APPLICATIONS

This patent application is a National Stage Entry of PCT/CN2019/076745 filed on Mar. 1, 2019, the disclosure of which is incorporated by reference herein in its entirety as part of the present application.

BACKGROUND

Embodiments of the present disclosure relate to a shift register unit, a gate driving circuit, a display device, and a driving method.

In the display field, especially in Organic Light-Emitting Diode (OLED) display panels, the gate driving circuit is currently generally integrated in a gate driving chip (GATE IC). The area of the chip in the IC design is the main factor affecting the cost of the chip. How to effectively reduce the area of the chip is a technical developer's important consideration.

At present, the gate driving circuit for OLEDs is usually composed of three sub-circuits, that is, a detection circuit, a display circuit, and a coupling circuit (or a gate circuit) that outputs a composite pulse of both. Such a circuit structure is very complex and cannot meet the requirements of a high-resolution narrow bezel of a display panel.

BRIEF DESCRIPTION

A first aspect of the present disclosure provides a shift register unit including a blank input circuit, a blank pull-up circuit, a display input circuit, and an output circuit. The blank input circuit is configured to charge a pull-up control node in response to a compensation selection control signal and hold the level of the pull-up control node. The blank pull-up circuit is configured to charge a pull-up node by using a first clock signal under the control of the level of the pull-up control node and the first clock signal. The display input circuit is configured to charge the pull-up node in response to a display input signal. The output circuit is configured to output a plurality of output clock signals to a plurality of output terminals respectively under the control of the level of the pull-up node and the plurality of output clock signals. The plurality of output terminals include a shift signal output terminal and a plurality of pixel signal output terminals. The plurality of pixel signal output terminals are configured to output a plurality of pixel signals to a plurality of rows of pixel units respectively.

In an embodiment of the present disclosure, the blank input circuit includes a first transistor and a first capacitor. A control electrode of the first transistor is coupled to a compensation selection control terminal to receive the compensation selection control signal, a first electrode of the first transistor is coupled to a blank input signal terminal, and a second electrode of the first transistor is coupled to the pull-up control node. A first electrode of the first capacitor is coupled to the pull-up control node, and a second electrode of the first capacitor is coupled to a first voltage terminal.

In an embodiment of the present disclosure, the blank pull-up circuit includes a second transistor and a third transistor. A control electrode of the second transistor is coupled to the pull-up control node, a first electrode of the second transistor is coupled to a first clock signal terminal to receive the first clock signal, and a second electrode of the second transistor is coupled to a first electrode of the third transistor. A control electrode of the third transistor is coupled to the first clock signal terminal to receive the first clock signal, and a second electrode of the third transistor is coupled to the pull-up node.

In an embodiment of the present disclosure, the shift register unit further includes a blank pull-up holding circuit. The blank pull-up holding circuit is coupled to the pull-up control node and is configured to pull up and hold the pull-up control node in response to the first clock signal. The blank pull-up holding circuit includes a first coupling capacitor. A first electrode of the first coupling capacitor is coupled to the first clock signal terminal to receive the first clock signal, and a second electrode of the first coupling capacitor is coupled to the pull-up control node.

In an embodiment of the present disclosure, the blank pull-up holding circuit further includes a second coupling capacitor. A first electrode of the second coupling capacitor is coupled to the second electrode of the second transistor, and a second electrode of the second coupling capacitor is coupled to the pull-up control node.

In an embodiment of the present disclosure, the display input circuit includes a fourth transistor. A control electrode of the fourth transistor is coupled to a display input signal terminal to receive the display input signal. A first electrode of the fourth transistor is coupled to a second voltage terminal to receive a second voltage, and a second electrode of the fourth transistor is coupled to the pull-up node.

In an embodiment of the present disclosure, the shift signal output sub-circuit includes a fifth transistor. A control electrode of the fifth transistor is coupled to the pull-up node, a first electrode of the fifth transistor is coupled to a shift clock signal terminal to receive a shift clock signal, and a second electrode of the fifth transistor is coupled to the shift signal output terminal. One of the plurality of pixel signal output sub-circuits includes a sixth transistor. A control electrode of the sixth transistor is coupled to the pull-up node, a first electrode of the sixth transistor is coupled to one of a plurality of pixel clock signal terminals to receive one of a plurality of pixel clock signals, and a second electrode of the sixth transistor is coupled to one of the plurality of pixel signal output terminals.

In an embodiment of the present disclosure, the shift register unit further includes a first pull-down control circuit and a pull-down circuit. The first pull-down control circuit is configured to control the level of a pull-down node under the control of the level of the pull-up node. The pull-down circuit is configured to pull-down and reset the pull-up node, the shift signal output terminal, and the plurality of pixel signal output terminals under the control of the level of the pull-down node.

In an embodiment of the present disclosure, the first pull-down control circuit includes a seventh transistor, an eighth transistor, and a ninth transistor. A control electrode of the seventh transistor is coupled to a first electrode of the seventh transistor and is configured to be coupled to a third voltage terminal to receive a third voltage, and a second electrode of the seventh transistor is coupled to the pull-down node. A control electrode of the eighth transistor is coupled to a first electrode of the eighth transistor and is configured to be coupled to a fourth voltage terminal to receive a fourth voltage, and a second electrode of the eighth transistor is coupled to the pull-down node. A control electrode of the ninth transistor is coupled to the pull-up node, a first electrode of the ninth transistor is coupled to the pull-down node, and a second electrode of the ninth transistor is coupled to a fifth voltage terminal to receive a fifth voltage.

In an embodiment of the present disclosure, the pull-down circuit includes a tenth transistor, an eleventh transistor, and a twelfth transistor. A control electrode of the tenth transistor is coupled to the pull-down node, a first electrode of the tenth transistor is coupled to the pull-up node, a second electrode of the tenth transistor is coupled to a fifth voltage terminal to receive a fifth voltage. A control electrode of the eleventh transistor is coupled to the pull-down node, a first electrode of the eleventh transistor is coupled to the shift signal output terminal, and a second electrode of the eleventh transistor is coupled to the fifth voltage terminal to receive the fifth voltage. A control electrode of the twelfth transistor is coupled to the pull-down node, a first electrode of the twelfth transistor is coupled to one of the plurality of pixel signal output terminals, and a second electrode of the twelfth transistor is coupled to the fifth voltage terminal to receive the fifth voltage.

In an embodiment of the present disclosure, the shift register unit further includes a second pull-down control circuit and a third pull-down control circuit. The second pull-down control circuit is configured to control the level of the pull-down node in response to the first clock signal. The third pull-down control circuit is configured to control the level of the pull-down node in response to the display input signal.

In an embodiment of the present disclosure, the second pull-down control circuit includes a thirteenth transistor, and the third pull-down control circuit includes a fourteenth transistor. A control electrode of the thirteenth transistor is coupled to a first clock signal terminal to receive the first clock signal, a first electrode of the thirteenth transistor is coupled to the pull-down node, and a second electrode of the thirteenth transistor is coupled to a fifth voltage terminal to receive a fifth voltage. A control electrode of the fourteenth transistor is coupled to a display input signal terminal to receive the display input signal, a first electrode of the fourteenth transistor is coupled to the pull-down node, and a second electrode of the fourteenth transistor is coupled to the fifth voltage terminal to receive the fifth voltage.

In an embodiment of the present disclosure, the second pull-down control circuit includes a thirteenth transistor and a seventeenth transistor, and the third pull-down control circuit includes a fourteenth transistor. A control electrode of the thirteenth transistor is coupled to a first clock signal terminal to receive the first clock signal, a first electrode of the thirteenth transistor is coupled to the pull-down node, and a second electrode of the thirteenth transistor is coupled to a first electrode of the seventeenth transistor. A control electrode of the seventeenth transistor is coupled to the pull-up control node, and a second electrode of the seventeenth transistor is coupled to a fifth voltage terminal to receive a fifth voltage. A control electrode of the fourteenth transistor is coupled to a display input signal terminal to receive the display input signal, a first electrode of the fourteenth transistor is coupled to the pull-down node, and a second electrode of the fourteenth transistor is coupled to the fifth voltage terminal to receive the fifth voltage.

In an embodiment of the present disclosure, the shift register unit further includes a display reset circuit and a global reset circuit. The display reset circuit is configured to reset the pull-up node in response to a display reset signal. The global reset circuit is configured to reset the pull-up node in response to a global reset signal.

In an embodiment of the present disclosure, the display reset circuit includes a fifteenth transistor, and the global reset circuit includes a sixteenth transistor. A control electrode of the fifteenth transistor is coupled to a display reset signal terminal to receive the display reset signal, a first electrode of the fifteenth transistor is coupled to the pull-up node, and a second electrode of the fifteenth transistor is coupled to a fifth voltage terminal to receive a fifth voltage. A control electrode of the sixteenth transistor is coupled to a global reset signal terminal to receive the global reset signal, a first electrode of the sixteenth transistor is coupled to the pull-up node, and a second electrode of the sixteenth transistor is coupled to the fifth voltage terminal to receive the fifth voltage.

A second aspect of the present disclosure provides a gate driving circuit including a plurality of shift register units of any one of the preceding.

In an embodiment of the present disclosure, an Mth-stage shift register unit outputs pixel signals for pixel units of a 2M−1th row and pixel signals for pixel units of a 2Mth row. A shift signal output terminal of the Mth-stage shift register unit is coupled to a display input signal terminal of an M+1th-stage shift register unit. A display reset signal terminal of the Mth-stage shift register unit is coupled to a shift signal output terminal of an M+2th stage shift register unit. M is an integer greater than zero.

A third aspect of the present disclosure provides a display device including the gate driving circuit of any one of the preceding.

A fourth aspect of the present disclosure provides a driving method of a shift register unit according to any one of the preceding, including in a display period of a frame, outputting the shift signal to another shift register unit through the shift signal output terminal; and in a display period of a frame, outputting a plurality of pixel signals respectively to a plurality of rows of pixel units through the plurality of pixel signal output terminals. The plurality of pixel signals include a plurality of display output signals.

In an embodiment of the present disclosure, in a display period of a frame, the plurality of pixel clock signals are respectively inputted into the plurality of pixel signal output sub-circuits based on a display timing of the plurality of rows of pixel units. The display timing is a row scan display timing that causes each row of the plurality of rows of pixel units to be displayed in sequence. In a display period of a frame, the plurality of pixel signal output sub-circuits respectively output a plurality of output clock signals to a plurality of output terminals under the control of the plurality of output clock signals, as a plurality of display output signals.

In an embodiment of the present disclosure, the driving method of the shift register unit further includes in a display period of a frame, the blank input circuit charging the pull-up control node in response to the compensation selection control signal and holding the level of the pull-up control node, in a blank period of a frame, the blank pull-up circuit using the first clock signal to charge the pull-up node under the control of the level of the pull-up control node and the first clock signal, in a blank period of a frame, one of the plurality of pixel signal output terminals outputting a pixel signal to one of the plurality of rows of pixel units, wherein the pixel signal includes a blank output signal.

In an embodiment of the present disclosure, in a blank period of a frame, one of the plurality of pixel clock signals is inputted into one of the plurality of pixel signal output sub-circuits. In a blank period of a frame, one of the plurality of pixel signal output sub-circuits outputs one of the plurality of output clock signals to one of the plurality of output terminals under the control of one of the plurality of pixel clock signals, as a blank output signal.

BRIEF DESCRIPTION OF THE DRAWINGS

In order to more clearly illustrate the technical solutions of the embodiments of the present disclosure, the drawings of the embodiments will be briefly introduced below. Obviously, the drawings in the following description only relate to some embodiments of the present disclosure, rather than limiting the present disclosure.

FIGS. 7A and 7B are circuit diagrams of still another shift register unit provided by an embodiment of the present disclosure, wherein FIG. 7A shows parts other than an output circuit and transistors for pulling it down, and FIG. 7B shows the output circuit and the transistors for pulling it down;

FIGS. 8A and 8B are circuit diagrams of still another shift register unit provided by an embodiment of the present disclosure, wherein FIG. 8A shows parts other than an output circuit and transistors for pulling it down, and FIG. 8B shows the output circuit and the transistors for pulling it down;

DETAILED DESCRIPTION

Figure 1:
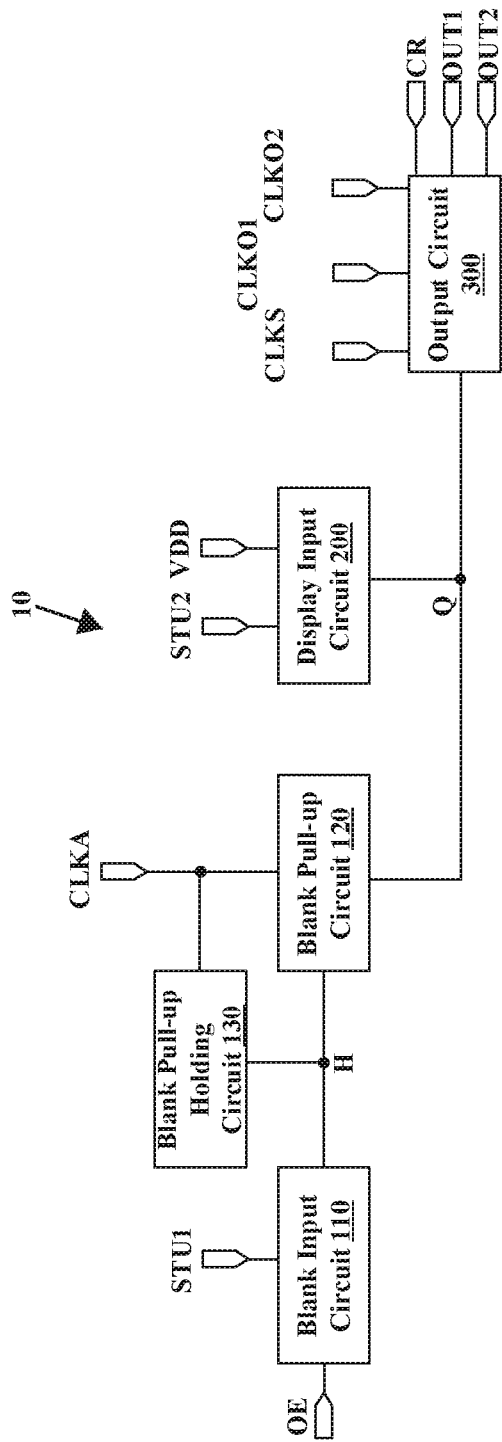
FIG. 1 is a schematic diagram of a shift register unit according to an embodiment of the present disclosure.

In order to make the technical solutions and advantages of the embodiments of the present disclosure more clear, the technical solutions of the embodiments of the present disclosure will be clearly and completely described below with reference to the accompanying drawings of the embodiments of the present disclosure. Obviously, the described embodiments are a part of embodiments of the present disclosure, but not all the embodiments. Based on the described embodiments of the present disclosure, all other embodiments obtained by a person of ordinary skill in the art without creative labor shall fall within the protection scope of the present disclosure.

Unless otherwise defined, the technical or scientific terms used in the present disclosure shall have the ordinary meanings understood by those of ordinary skills in the field to which the present disclosure belongs. The terms "first", "second", and the like used in the present disclosure do not indicate any order, quantity, or importance, but are only used to distinguish different components. Similarly, "a", "an", or "the" and the like do not indicate a limit on quantity, but rather indicate that there is at least one. A word such as "including" or "containing" means that the element or item appearing before that word covers the element or item appearing after that word and the equivalent thereof without excluding other elements or items. Words such as "coupled" or "connected" are not limited to physical or mechanical couplings, but may include electrical couplings, whether direct or indirect. "Up", "down", "left", "right", etc. are only used to indicate the relative position relationship. When the absolute position of the described object changes, the relative position relationship may also change accordingly.

When compensating a sub-pixel unit in an OLED display panel, in addition to setting a pixel compensation circuit in the sub-pixel unit for internal compensation, external compensation may also be performed by setting a sensing transistor. When performing external compensation, a gate driving circuit composed of shift register units needs to provide a driving signal for a scanning transistor and a sensing transistor to the sub-pixel units in the display panel respectively, for example, to provide, in a display period of a frame, a scanning driving signal for the scanning transistor, and to provide, in a blank period of a frame, a sensing driving signal for the sensing transistor.

In an external compensation method, the sensing driving signal outputted by the gate driving circuit is sequentially scanned row by row. For example, the sensing driving signal for the first row of sub-pixel units in the display panel is outputted in the blank period of the first frame, the sensing driving signal for the second row of sub-pixel units in the display panel is outputted in the blank period of the second frame, and so on. Row-by-row sequential output is conducted at the frequency of outputting the sensing driving signal corresponding to one row of sub-pixel units in each frame, that is, row-by-row sequential compensation is completed for the display panel.

However, when the above-mentioned row-by-row sequential compensation method is adopted, display failure problems may occur. One problem is that there is a scanning line that moves row by row in the scanning display of a plurality of frames. Another problem is that the difference in time of performing external compensation will cause a large difference in brightness in different areas of the display panel. For example, when performing external compensation on the 100th row of sub-pixel units in the display panel, although the 10th row of sub-pixel units in the display panel have been externally compensated, however, at this time, the luminous brightness of the 10th row of sub-pixel units may have changed, for example, the luminous brightness has been reduced, which may cause uneven brightness in different areas of the display panel. This problem is more obvious in large-sized display panels.

In addition, for example, in a shift register unit, a transistor may have a threshold voltage drift (for example, a negative drift), which may cause a leakage of a pull-up control node. For example, in a blank period of a frame, when a leakage occurs in the pull-up control node, the pull-up node is insufficiently charged, which may cause the shift register unit to fail to normally output a sensing driving signal for a sensing transistor.

In view of the above problems, an embodiment of the present disclosure provides a shift register unit including a blank input circuit, a blank pull-up circuit, a display input circuit, and an output circuit. The blank input circuit is configured to charge the pull-up control node in response to a compensation selection control signal and hold the level of the pull-up control node. The blank pull-up circuit is configured to charge a pull-up node by using a first clock signal under the control of the level of the pull-up control node and the first clock signal. The display input circuit is configured to charge the pull-up node in response to a display input signal. The output circuit is configured to output a plurality of output clock signals to a plurality of output terminals respectively under the control of the level of the pull-up node and the plurality of output clock signals. The plurality of output terminals include a shift signal output terminal and a plurality of pixel signal output terminals. The plurality of pixel signal output terminals are configured to output a plurality of pixel signals to a plurality of rows of pixel units respectively. Embodiments of the present disclosure also provide a gate driving circuit, a display device, and a driving method corresponding to the above-mentioned shift register unit.

The shift register unit, the gate driving circuit, the display device, and the driving method provided by the embodiments of the present disclosure may realize driving of a plurality of rows of pixel units, reduce the number of shift register units, and reduce the area required by the gate driving circuit.

It should be noted that, in the embodiments of the present disclosure, random compensation refers to an external compensation method that is different from row-by-row sequential compensation, and in a blank period of a certain frame, a sensing driving signal corresponding to any row of sub-pixel units in the display panel may be randomly outputted. The following embodiments are the same, and are not described again.

In addition, in the embodiments of the present disclosure, for the purpose of explanation, the definition of "a frame", "each frame", or "a certain frame" includes a display period and a blank period in sequence. For example, the gate driving circuit outputs a display output signal in a display period and the display output signal may drive the display panel to achieve a complete scanning display of an image from the first row to the last row, while the gate driving circuit outputs a blank output signal in a blank period and the blank output signal may be used to drive a sensing transistor in a certain row of sub-pixel units in the display panel to complete external compensation on the row of sub-pixel units.

The embodiments of the present disclosure and examples thereof will be described in detail below with reference to the drawings.

FIG. 1 is a schematic diagram of a shift register unit according to an embodiment of the present disclosure.

An embodiment of the present disclosure provides a shift register unit 10. As shown in FIG. 1, the shift register unit 10 includes a blank input circuit 110, a blank pull-up circuit 120, a blank pull-up holding circuit 130, a display input circuit 200, and an output circuit 300. The blank pull-up circuit 120, the display input circuit 200, and the output circuit 300 are coupled through a pull-up node Q.

The blank input circuit 110 is configured to charge a pull-up control node H in response to a compensation selection control signal and hold the level of the pull-up control node H.

In some embodiments, the blank input circuit 110 may be coupled to a blank input signal terminal STU1 and a compensation selection control terminal OE, and thus may charge the pull-up control node H using a blank input signal inputted from the blank input signal terminal STU1 under the control of a compensation selection control signal inputted by the compensation selection control terminal OE, and hold the level of the pull-up control node H. For example, the blank input circuit 110 may charge the pull-up control node H in a display period of a frame, thereby pulling up the pull-up control node H to a high level, and may hold the high level of the pull-up control node H to a blank period of the frame.

For example, when a plurality of shift register units 10 are cascaded to form a gate driving circuit, except for the first-stage shift register unit, the blank input signal terminal STU1 of the shift register unit 10 at each stage may be coupled to the output terminals of shift register units 10 at another stage (for example, the shift register unit at the preceding second stage or the shift register unit of the following third stage, etc.), or may be coupled to their own output terminal. For example, in a case where the output terminal includes a shift signal output terminal CR and a pixel signal output terminal OUT, the blank input signal terminal STU1 may be coupled to the shift signal output terminal CR to receive a shift signal, for example, a shift signal CR<N−2> from the shift register unit at the preceding second stage, or a shift signal CR<N+3> from the shift register unit of the following third stage, or its own shift signal CR<N>, etc. It should be understood that when the shift register unit at a stage corresponds to only one row of pixel units, N may represent the stage number which the current shift register unit has, and also represent the row number which the current pixel units have. When a shift register unit at a stage corresponds to a plurality of rows of pixel units, that is, when the stage number is not identical with the row number, depending on the specific timing, N may represent any one of the stage number which the current shift register unit has, and the row number which the current pixel units have.

The blank pull-up circuit 120 is configured to charge the pull-up node Q by using a first clock signal under the control of the level of the pull-up control node H and the first clock signal. For example, in some embodiments, the blank pull-up circuit 120 may be coupled to a first clock signal terminal CLKA to receive the first clock signal, and the blank pull-up circuit 120 may also be coupled to the pull-up control node H to receive the control from the level of the pull-up control node H. For example, when both the pull-up control node H and the first clock signal are at a high level, the blank pull-up circuit 120 may use the high-level first clock signal to charge the pull-up node Q. For example, in a blank period of a frame, the blank pull-up circuit 120 charges the pull-up node Q.

In an embodiment of the present disclosure, the shift register unit further includes a blank pull-up holding circuit, and the blank pull-up holding circuit is coupled to the pull-up control node and is configured to pull up and hold the pull-up control node in response to the first clock signal.

The shift register unit, the gate driving circuit, the display device and the driving method provided by the embodiments of the present disclosure may pull up and hold the pull-up control node, so that the pull-up node is more sufficiently charged in a blank period of a frame so as to avoid output anomalies; at the same time, taking into account row-by-row sequential compensation (for example row-by-row sequential compensation is required in shutdown detection), random compensation may also be achieved, which may avoid display problems such as a scanning line and uneven display brightness caused by row-by-row sequential compensation.

The blank pull-up holding circuit 130 is coupled to the pull-up control node H, and is configured to pull up and hold the pull-up control node H in response to the first clock signal. For example, in some embodiments, the blank pull-up holding circuit 130 may be coupled to the first clock signal terminal CLKA to receive the first clock signal. For example, when the first clock signal changes from a low level to a high level, the blank pull-up holding circuit 130 may pull up and hold the pull-up control node H through a coupling effect, so that the level of the pull-up control node H is further pulled up. For example, in a blank period of a frame, the blank pull-up holding circuit 130 pulls up and holds the pull-up control node H, thus may avoid an electric leakage of the pull-up control node H, so that the pull-up node Q is more sufficiently charged in the blank period of the frame to avoid output anomalies.

The display input circuit 200 is configured to charge the pull-up node Q in response to a display input signal. For example, in some embodiments, the display input circuit 200 may be coupled to a display input signal terminal STU2 to receive the display input signal, so that the display input circuit 200 is turned on under the control of the display input signal. For example, the display input circuit 200 may also be coupled to a second voltage terminal VDD to receive a second voltage, for example, the second voltage is a DC high-level signal. For example, in a display period of a frame, the display input circuit 200 is turned on under the control of the display input signal, so as to charge the pull-up node Q by using the second voltage. It should be noted that, in the embodiment of the present disclosure, a second voltage terminal VDD may be configured to provide a DC high-level signal. The following embodiments are the same, and details are not described herein again.

For example, when a plurality of shift register units 10 are cascaded to form a gate driving circuit, a display input signal terminal STU2 of a shift register unit at each stage may be coupled to the output terminal of the shift register unit at the preceding second stage. For example, in a case where the output terminal includes a shift signal output terminal CR and a pixel signal output terminal OUT, the display input signal terminal STU2 may be coupled to the shift signal output terminal CR (for example, CR<N−2> of the shift register unit at the preceding second stage).

It should be noted that, in an embodiment of the present disclosure, the display input circuit 200 may also adopt other configurations, as long as the corresponding functions may be realized, and the embodiments of the present disclosure do not limit this.

The output circuit 300 is configured to output a plurality of output clock signals to a plurality of output terminals respectively under the control of the level of the pull-up node Q and the plurality of output clock signals. The plurality of output clock signals include a shift clock signal CLKS for outputting a shift signal and a plurality of pixel clock signals CLKO for outputting a plurality of pixel signals. The output circuit 300 includes a shift signal output sub-circuit and a plurality of pixel signal output sub-circuits. The plurality of output terminals include a shift signal output terminal CR and a plurality of pixel signal output terminals OUT1 and OUT2 (hereinafter, when not distinguished, they are also simply referred to as OUTs for ease of description). The shift signal output terminal CR is configured to output a shift signal to another shift register unit for scanning shift of the upper and lower shift register units. The plurality of pixel signal output terminals OUT1 and OUT2 are configured to output a plurality of pixel signals to a plurality of rows of pixel units respectively. It should be understood that two pixel signal output terminals are shown in FIG. 1 as an example, however, this is not a limitation on the present disclosure. The number of pixel signal output terminals may be greater than two.

The pixel signal may be a composite output signal. For example, the composite output signal may include a display output signal and a blank output signal.

In a display period of a frame, the output circuit 300 outputs a display output signal to an output terminal under the control of the level of the pull-up node Q. In this display period, the shift signal output terminal CR outputs a shift signal to another shift register unit for scanning shift of the upper and lower shift register units, and the display output signal outputted from the pixel signal output terminal OUT may be used to drive the sub-pixel unit in the display panel for scanning display. Specifically, in a display period of a frame, a plurality of pixel clock signals are inputted into a plurality of pixel signal output sub-circuits respectively based on a display timing of a plurality of rows of pixel units. The plurality of pixel signal output sub-circuits output the plurality of pixel clock signals to the plurality of pixel signal output terminals OUT1 and OUT2 respectively under the control of the plurality of pixel clock signals as a plurality of display output signals. The display timing may be a row scan display timing that causes each row of the plurality of rows of pixel units to be displayed in sequence. According to such a setting, the plurality of pixel clock signals are sequentially inputted corresponding to the order of row scanning, so that the plurality of display output signals may be sequentially outputted to each row of pixel units that need to be scanned. For example, OUT1 may first output a high-level signal to drive a row of pixel units. Then, OUT2 outputs a high-level signal to drive the next row of pixel units.

In a blank period of a frame, the output circuit 300 outputs a blank output signal to the pixel signal output terminal OUT under the control of the level of the pull-up node Q, and the blank output signal may be used to drive a sensing transistor. Specifically, if only one row of pixel units needs to be sensed, one of the plurality of pixel clock signals is inputted into one of the plurality of pixel signal output sub-circuits in a blank period of a frame. One of the plurality of pixel signal output sub-circuits outputs one of the plurality of output clock signals to one of the plurality of pixel signal output terminals under the control of one of the plurality of pixel clock signals as a blank output signal.

For example, a plurality of shift register units 10 provided by the embodiments of the present disclosure may be cascaded to form a gate driving circuit, and the gate driving circuit may implement random compensation, that is, in a certain frame, the gate driving circuit may be used to drive the sensing transistor in any row of sub-pixel units, thereby completing the external compensation of the row of sub-pixel units.

For example, in a case where the blank input signal terminal STU1 of the shift register unit 10 is coupled to the shift signal output terminal CR<N> of the shift register unit 10, when external compensation is needed for the fifth row of sub-pixel units, the compensation selection control signal and the display output signal for driving the fifth row of sub-pixel units may be made the same.

For another example, in a case where the blank input signal terminal STU1 of the shift register unit 10 is coupled to the shift signal output terminal CR<N−2> of the shift register unit 10 at the preceding second stage, when external compensation is needed for the fifth row of sub-pixel units, the compensation selection control signal and the display output signal for driving the third row of sub-pixel units may be made the same.

For another example, in a case where the blank input signal terminal STU1 of the shift register unit 10 is coupled to the shift signal output terminal CR<N+3> of the shift register unit 10 at the following third stage, when external compensation is needed for the fifth row of sub-pixel units, the compensation selection control signal and the display output signal for driving the eighth row of sub-pixel units may be made the same.

In addition, in the shift register unit 10 provided in the embodiment of the present disclosure, by setting the blank pull-up holding circuit 130, the pull-up control node H may be pulled up and held, so that the pull-up node Q is more sufficiently charged in the blank period of a frame, so as to avoid output anomalies.

It should be noted that, in the embodiment of the present disclosure, "the shift register unit at the preceding second two stage" means the shift register unit located two stages preceding the stage at which the current shift register unit is located, and "the shift register unit at the following third stage" means the shift register unit located three stages following the stage at which the current shift register unit is located. The "preceding" and "following" here are relative. In a case where row scanning may be performed in the reverse direction, the circuit connection manner may remain the same, but the same shift register units will be referred to as "the shift register unit at the following second stage" and "the shift register unit at the preceding third stage". The following embodiments are the same and will not be described again.

Figure 2:
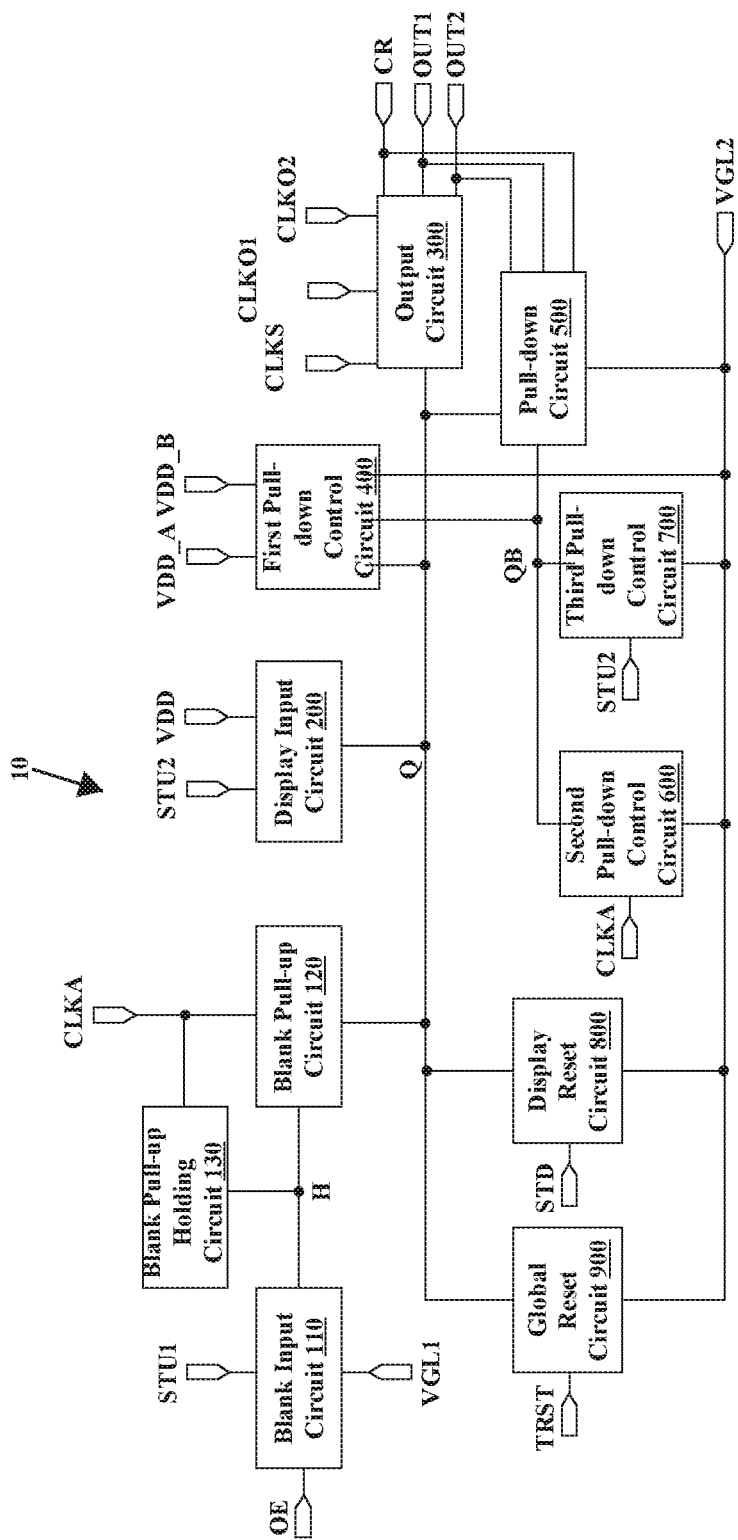
FIG. 2 is a schematic diagram of another shift register unit according to an embodiment of the present disclosure.

FIG. 2 is a schematic diagram of another shift register unit according to an embodiment of the present disclosure.

In some embodiments, as shown in FIG. 2, the shift register unit 10 may further include a first pull-down control circuit 400 configured to be control the level of the pull-down node QB under the control of the level of the pull-up node Q. For example, in one example, the first pull-down control circuit 400 is coupled to a third voltage terminal VDD_A and a fifth voltage terminal VGL2. It should be noted that, in the embodiment of the present disclosure, the fifth voltage terminal VGL2 may be for example configured to provide a DC low-level signal. The following embodiments are the same and will not be described herein again.

For example, when the pull-up node Q is at a high level, the first pull-down control circuit 400 may pull the pull-down node QB down to a low level through the fifth voltage terminal VGL2. As another example, when the potential of the pull-up node Q is at a low level, the first pull-down control circuit 500 may use a third voltage (for example, at a high level) inputted from a third voltage terminal VDD_A to charge the pull-down node QB so as to pull the pull-down node QB up to a high level.

In another example, the first pull-down control circuit 400 may also be coupled to a fourth voltage terminal VDD_B to receive a fourth voltage (for example, at a high level). For example, the third voltage terminal VDD_A and a fourth voltage terminal VDD_B may be configured to have a high level inputted therein alternately, that is, when the third voltage terminal VDD_A is inputted with a high level, the fourth voltage terminal VDD_B is inputted with a low level, and when the third voltage terminal VDD_A is inputted with a low level, the fourth voltage terminal VDD_B is inputted with a high level. This may avoid the fatigue and damage that may be caused when a circuit element is always connected to a high-level signal.

In some embodiments, as shown in FIG. 2, the shift register unit 10 may further include a pull-down circuit 500 configured to pull-down and reset the pull-up node Q and each output terminal under the control of the level of the pull-down node QB. For example, in a case where the output terminal includes a shift signal output terminal CR and a pixel signal output terminal OUT, the pull-down circuit 500 may pull-down and reset the shift signal output terminal CR and the pixel signal output terminal OUT at the same time.

For example, the pull-down circuit 500 is coupled to the fifth voltage terminal VGL2. When turned on under the control of the level of the pull-down node QB, the pull-down circuit 500 may pull down the pull-up node Q, the shift signal output terminal CR, and the pixel signal output terminal OUT through the fifth voltage terminal VGL2 so as to achieve reset. It should be noted that the fifth voltage terminal VGL2 in the embodiments of the present disclosure for example may be configured to provide a DC low-level signal, that is, the fifth voltage is at a low level. The following embodiments are the same, and are not described again.

In some embodiments, as shown in FIG. 2, the shift register unit 10 may further include a second pull-down control circuit 600 configured to control the level of the pull-down node QB in response to the first clock signal. For example, in one example, the second pull-down control circuit 600 may be coupled to the first clock signal terminal CLKA to receive a first clock signal, and also coupled to the fifth voltage terminal VGL2 to receive a fifth voltage at a low level. For example, in a blank period of a frame, the second pull-down control circuit 600 may be turned on in response to the first clock signal, so as to pull down the pull-down node QB by using the fifth voltage at a low level.

In some embodiments, as shown in FIG. 2, the shift register unit 10 may further include a third pull-down control circuit 700 configured to control the level of the pull-down node QB in response to a display input signal. For example, the third pull-down control circuit 700 may be coupled to the display input signal terminal STU2 to receive a display input signal, and also coupled to the fifth voltage terminal VGL2 to receive the fifth voltage at a low level. For example, in a display period of a frame, the third pull-down control circuit 700 may be turned on in response to the display input signal, so as to pull down the pull-down node QB by using the fifth voltage at a low level. Pulling down the pull-down node QB to a low potential may avoid the influence on the pull-up node Q from the pull-down node QB, so that the pull-up node Q is more sufficiently charged in the display period.

It should be noted that, regarding the display input signal end STU2, reference may be made to the corresponding descriptions above, and details are not repeated here.

In some embodiments, as shown in FIG. 2, the shift register unit 10 may further include a display reset circuit 800 configured to reset the pull-up node Q in response to a display reset signal. For example, in one example, the display reset circuit 800 may be coupled to a display reset signal terminal STD to receive a display reset signal, and also coupled to the fifth voltage terminal VGL2 to receive a fifth voltage at a low level. For example, in a display period of a frame, the display reset circuit 800 may be turned on in response to the display reset signal, so as to reset the pull-up node Q through the fifth voltage terminal VGL2. For example, when a plurality of shift register units 10 are cascaded to form a gate driving circuit, the display reset signal terminal STD of the shift register unit at each stage may be coupled to the output terminal of the shift register unit at the following fourth stage (such as a shift signal output terminal CR <N+4>).

In some embodiments, as shown in FIG. 2, the shift register unit 10 may further include a global reset circuit 900 configured to reset the pull-up node Q in response to a global reset signal. For example, in one example, the global reset circuit 900 is coupled to the global reset signal terminal TRST to receive a global reset signal, and also coupled to the fifth voltage terminal VGL2 to receive a fifth voltage at a low level. For example, when a plurality of shift register units 10 are cascaded to form a gate driving circuit, the global reset circuit 900 in the shift register unit 10 at each stage is turned on in response to the global reset signal before the display period of a frame and resets the pull-up node Q through the fifth voltage terminal VGL2, thereby realizing a global reset of the shift register units 10 at all stages.

It should be noted that, in the embodiment of the present disclosure, for example, the low-level signals inputted to the first voltage terminal VGL1 and the fifth voltage terminal VGL2 may be the same, that is, the two voltage terminals may be coupled to the same signal line to receive the same low-level signal. As another example, the two voltage terminals may be respectively coupled to different signal lines to receive different low-level signals respectively. The embodiments of the present disclosure do not limit the manner of setting the first voltage terminal VGL1 and the fifth voltage terminal VGL2.

Those skilled in the art may understand that although the first pull-down control circuit 400, the pull-down circuit 500, the second pull-down control circuit 600, the third pull-down control circuit 700, the display reset circuit 800, and the global reset circuit 900 are shown in the shift register unit 10 in FIG. 2, however, the above example cannot limit the protection scope of the present disclosure. In practical applications, those skilled in the art may choose to use or not use one or more of the above circuits according to the situation. All various combinations and modifications based on the foregoing circuits do not depart from the principles of the present disclosure, and will not be described herein in details again.

Figure 3:
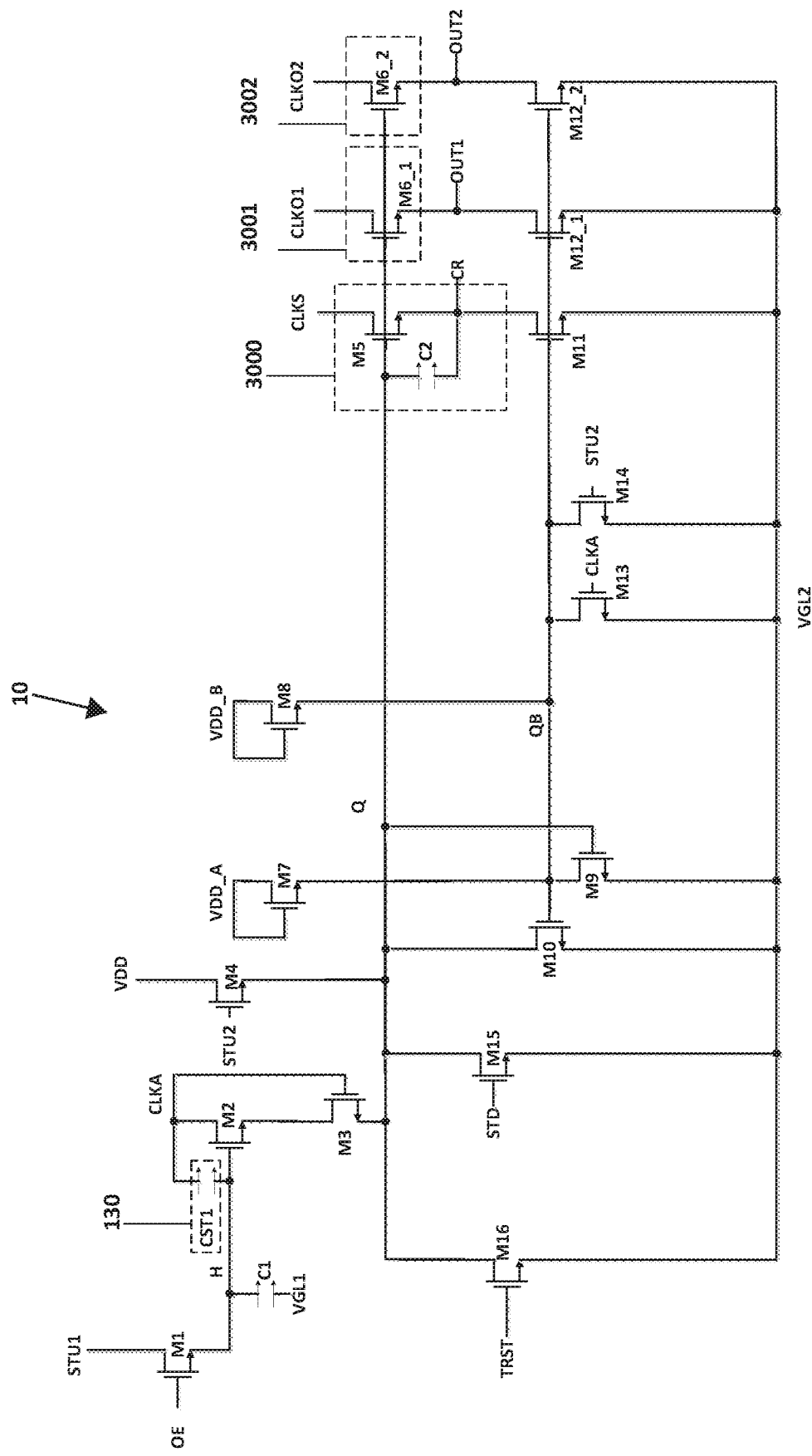
FIG. 3 is a circuit diagram of a shift register unit according to an embodiment of the present disclosure.

FIG. 3 is a circuit diagram of a shift register unit according to an embodiment of the present disclosure.

In one example of an embodiment of the present disclosure, the shift register unit 10 shown in FIG. 2 may be implemented as the circuit structure shown in FIG. 3. As shown in FIG. 3, the shift register unit 10 includes first to sixteenth transistors M1-M16, a first capacitor C1, a second capacitor C2, and a first coupling capacitor CST1. In the drawings, M6_1 and M6_2 respectively represent the sixth transistor in the first pixel signal output sub-circuit 3001 and the second pixel signal output sub-circuit 3002. When no distinction is needed, they may both be represented by M6. The output terminal includes a shift signal output terminal CR and a pixel signal output terminal OUT. Both the shift signal output terminal CR and the pixel signal output terminal OUT may output a composite output signal. OUT1 and OUT2 respectively represent the pixel signal output terminal in the first pixel signal output sub-circuit 3001 and the second pixel signal output sub-circuit 3002. When no distinction is needed, they may both be represented by OUT. It should be noted that the transistors shown in FIG. 3 are all described by taking N-type transistors as an example.

As shown in FIG. 3, the blank input circuit 110 may be implemented to include a first transistor M1 and a first capacitor C1. The control electrode of the first transistor M1 is coupled to a compensation selection control terminal OE to receive a compensation selection control signal. The first electrode of the first transistor M1 is coupled to the blank input signal terminal STU1 to receive a blank input signal. The second electrode of the first transistor M1 is coupled to the pull-up control node H. For example, when the compensation selection control signal is a high-level ON signal, the first transistor M1 is turned on, so as to charge the pull-up control node H by using the blank input signal.

The first electrode of the first capacitor C1 is coupled to the pull-up control node H, and the second electrode of the first capacitor C1 is coupled to the first voltage terminal VGL1. By setting the first capacitor C1, the potential of the pull-up control node H may be held. For example, in a display period of a frame, the blank input circuit 110 charges the pull-up control node H to a high potential, and the first capacitor C1 may hold the high potential of the pull-up control node H until the blank period of the frame. It should be noted that, in the embodiment of the present disclosure, in addition to being coupled to the first voltage terminal VGL1, the second electrode of the first capacitor C1 may also be coupled to other voltage terminals, for example the second electrode of the first capacitor C1 may be grounded, which is not limited in the embodiments of the present disclosure.

As shown in FIG. 3, the blank pull-up circuit 120 may be implemented to include a second transistor M2 and a third transistor M3. The control electrode of the second transistor M2 is coupled to the pull-up control node H, the first electrode of the second transistor M2 is coupled to the first clock signal terminal CLKA to receive the first clock signal, the second electrode of the second transistor M2 is coupled to the first electrode of the third transistor M3, the control electrode of the third transistor M3 is coupled to the first clock signal terminal CLKA to receive the first clock signal, and the second electrode of the third transistor M3 is coupled to the pull-up node Q. For example, in a blank period of a frame, the second transistor M2 is turned on under the control of the pull-up control node H. When the first clock signal is at a high level, the third transistor M3 is turned on under the control of the first clock signal, so that the high-level first clock signal may charge the pull-up node Q through the second transistor M2 and the third transistor M3.

As shown in FIG. 3, the blank pull-up holding circuit 130 may be implemented as a first coupling capacitor CST1. The first electrode of the first coupling capacitor CST1 is coupled to the first clock signal terminal CLKA to receive the first clock signal, and the second electrode of the first coupling capacitor CST1 is coupled to the pull-up control node H. For example, when the first clock signal changes from a low level to a high level, through the coupling effect of the first coupling capacitor CST1 the first clock signal may pull up and hold the pull-up control node H, so that the level of the pull-up control node H is further pulled up.

In the shift register unit 10 provided by the embodiment of the present disclosure, by setting the blank pull-up holding circuit 130, the pull-up control node H may be pulled up and held to avoid an electric leakage of the pull-up control node H, so that the pull-up node Q is charged more sufficiently, for example, in a blank period of a frame, to avoid output abnormalities.

As shown in FIG. 3, the display input circuit 200 may be implemented as a fourth transistor M4. The control electrode of the fourth transistor M4 is coupled to the display input signal terminal STU2 to receive a display input signal, the first electrode of the fourth transistor M4 is coupled to the second voltage terminal VDD to receive the second voltage, and the second electrode of the fourth transistor M4 is coupled to the pull-up node Q. For example, in a display period of a frame, the fourth transistor M4 is turned on under the control of the display input signal, thereby charging the pull-up node Q by using the second voltage.

As shown in FIG. 3, the shift signal output sub-circuit 3000 in the output circuit 300 may be implemented to include a fifth transistor M5 and a second capacitor C2. The control electrode of the fifth transistor M5 is coupled to the pull-up node Q, the first electrode of the fifth transistor M5 is coupled to the shift clock signal terminal CLKS to receive a shift clock signal, and the second electrode of the fifth transistor M5 is coupled to the shift signal output terminal CR. The first electrode of the second capacitor C2 is coupled to the pull-up node Q, and the second electrode of the second capacitor C2 is coupled to the second electrode of the fifth transistor M5. One of the plurality of pixel signal output sub-circuits in the output circuit 300 may include a sixth transistor M6. The control electrode of the sixth transistor M6 is coupled to the pull-up node Q, the first electrode of the sixth transistor M6 is coupled to the pixel clock signal terminal CLKO to receive a pixel clock signal as a composite output signal, and the second electrode of the sixth transistor M6 is coupled to the pixel signal output terminal OUT. The first pixel clock signal terminal CLKO1 and the second pixel clock signal terminal CLKO2 represent the pixel clock signal terminal in the first pixel signal output sub-circuit 3001 and the second pixel signal output sub-circuit 3002, respectively. When there is no need to distinguish, they may both be represented by CLKO.

For example, when the potential of the pull-up node Q is at a high level, the fifth transistor M5 and the sixth transistor M6 are turned on, so that the shift clock signal may be outputted to the shift signal output terminal CR, and the pixel clock signal may be outputted to the pixel signal output terminal OUT. Specifically, when the first pixel clock signal CLKO1 is at a high level, the sixth transistor M6_1 of the first pixel signal output sub-circuit 3001 communicates it to the first pixel signal output terminal OUT1, and when the second pixel clock signal CLKO2 is at a high level, the sixth transistor M6_2 of the second pixel signal output sub-circuit 3002 communicates it to the first pixel signal output terminal OUT2.

Specifically, when the first pixel clock signal CLKO1 is at a high level, the sixth transistor M6_1 of the first pixel signal output sub-circuit 3001 communicates it to the first pixel signal output terminal OUT1, and when the second pixel clock signal CLKO2 is at a high level, the sixth transistor M6_2 of the second pixel signal output sub-circuit 3002 communicates it to the first pixel signal output terminal OUT2.

For example, when a plurality of shift register units 10 are cascaded to form a gate driving circuit, the display input signal terminal STU2 of the shift register unit at each stage may be coupled to the shift signal output terminal CR <N−2> of the shift register unit at the preceding second stage. That is, the display input signal may be a signal outputted from the shift signal output terminal CR <N−2> of the shift register unit at the preceding second stage.

As shown in FIG. 3, the first pull-down control circuit 400 may be implemented to include a seventh transistor M7, an eighth transistor M8, and a ninth transistor M9. The control electrode and the first electrode of the seventh transistor M7 are coupled and are configured to be coupled to the third voltage terminal VDD_A to receive the third voltage, and the second electrode of the seventh transistor M7 is coupled to the pull-down node QB. The control electrode and the first electrode of the eighth transistor M8 are coupled and are configured to be coupled to the fourth voltage terminal VDD_B to receive a fourth voltage, and the second electrode of the eighth transistor M8 is coupled to the pull-down node QB. The control electrode of the ninth transistor M9 is coupled to the pull-up node Q, the first electrode of the ninth transistor M9 is coupled to the pull-down node QB, and the second electrode of the ninth transistor M9 is coupled to the fifth voltage terminal VGL2 to receive the fifth voltage.

For example, the third voltage terminal VDD_A and the fourth voltage terminal VDD_B may be configured to alternately be inputted with a high level, that is, when the third voltage terminal VDD_A is inputted with a high level, the fourth voltage terminal VDD_B is inputted with a low level, and when the third voltage terminal VDD_A is inputted with a low level, the fourth voltage terminal VDD_B is inputted with a high level, that is, only one of the seventh transistor M7 and the eighth transistor M8 is in an ON state, so that performance drift caused by that the transistor is turned on for a long time may be avoided. When the seventh transistor M7 or the eighth transistor M8 is turned on, the third voltage or the fourth voltage may charge the pull-down node QB, thereby pulling up the pull-down node QB to a high level. When the potential of the pull-up node Q is at a high level, the ninth transistor M9 is turned on. For example, in terms of transistor design, the ninth transistor M9 and the seventh transistor M7 (or the eighth transistor M8) may be such configured (for example in terms of the size ratio of the them, the threshold voltage, etc.) that when both M9 and M7 (M8) are turned on, the level of the pull-down node QB may still be pulled down to a low level, and this low level may make the tenth transistor M10, the eleventh transistor M11, and the twelfth transistor M12 remain off.

As shown in FIG. 3, the pull-down circuit 500 may be implemented to include a tenth transistor M10, an eleventh transistor M11, and a twelfth transistor M12. The control electrode of the tenth transistor M10 is coupled to the pull-down node QB, the first electrode of the tenth transistor M10 is coupled to the pull-up node Q, the second electrode of the tenth transistor M10 is coupled to the fifth voltage terminal VGL2 to receive the fifth voltage. The control electrode of the eleventh transistor M11 is coupled to the pull-down node QB, the first electrode of the eleventh transistor M11 is coupled to the shift signal output terminal CR, and the second electrode of the eleventh transistor M11 is coupled to the fifth voltage terminal VGL2 to receive the fifth voltage. The control electrode of the twelfth transistor M12 is coupled to the pull-down node QB, the first electrode of the twelfth transistor M12 is coupled to the pixel signal output terminal OUT, and the second electrode of the twelfth transistor M12 is coupled to the fifth voltage terminal VGL2 to receive the fifth voltage. In addition, not shown in the figure, the second electrode of the twelfth transistor M12 may be coupled to the sixth voltage terminal VGL3 to receive the sixth voltage instead of the fifth voltage. It should be noted that the sixth voltage terminal VGL3 in the embodiment of the present disclosure may be for example configured to provide a DC low-level signal, that is, the sixth voltage is at a low level. The following embodiments are the same, and will not be described again.

For example, when the potential of the pull-down node QB is at a high level, the tenth transistor M10, the eleventh transistor M11, and the twelfth transistor M12 are turned on, so that the fifth voltage (and the sixth voltage) may be used to pull down the pull-up node Q, the shift signal output terminal CR and the pixel signal output terminal OUT to reduce noise.

Referring to FIG. 3, it may be understood that when the output circuit 300 includes a plurality of pixel signal output sub-circuits, for example, the first pixel signal output sub-circuit 3001 and the second pixel signal output sub-circuit 3002, the pull-down circuit 500 may include a plurality of twelfth transistors, such as M12_1 and M12_2, respectively corresponding to the pixel signal output terminal OUT1 of the first pixel signal output sub-circuit 3001 and the pixel signal output terminal OUT2 of the second pixel signal output sub-circuit 3002.

As shown in FIG. 3, the second pull-down control circuit 600 may be implemented as a thirteenth transistor M13. The control electrode of the thirteenth transistor M13 is coupled to the first clock signal terminal CLKA to receive the first clock signal, the first electrode of the thirteenth transistor M13 is coupled to the pull-down node QB, and the second electrode of the thirteenth transistor M13 is coupled to the fifth voltage terminal VGL2 to receive the fifth voltage. For example, in a blank period of a frame, when the first clock signal is at a high level, the thirteenth transistor M13 is turned on, so that the pull-down node QB may be pulled down by using the fifth voltage at a low level.

As shown in FIG. 3, the third pull-down control circuit 700 may be implemented as a fourteenth transistor M14. The control electrode of the fourteenth transistor M14 is coupled to the display input signal terminal STU2 to receive the display input signal, the first electrode of the fourteenth transistor M14 is coupled to the pull-down node QB, and the second electrode of the fourteenth transistor M14 is coupled to the fifth voltage terminal VGL2 to receive the fifth voltage. For example, in a display period of a frame, the fourteenth transistor M14 may be turned on in response to the display input signal, so as to pull down the pull-down node QB by using the fifth voltage at a low level. Pulling down the pull-down node QB to a low potential may avoid the influence on the pull-up node Q from the pull-down node QB, so that the pull-up node Q is charged more sufficiently in the display period.

As shown in FIG. 3, the display reset circuit 800 may be implemented as a fifteenth transistor M15. The control electrode of the fifteenth transistor M15 is coupled to the display reset signal terminal STD to receive the display reset signal, the first electrode of the fifteenth transistor M15 is coupled to the pull-up node Q, and the second electrode of the fifteenth transistor M15 is coupled to the fifth voltage terminal VGL2 to receive the fifth voltage. For example, in a display period of a frame, the fifteenth transistor M15 may be turned on in response to a display reset signal, so that the pull-up node Q may be reset by using the fifth voltage at a low level. For example, when a plurality of shift register units 10 are cascaded to form a gate driving circuit, the display reset signal terminal STD of the shift register unit at each stage may be coupled to the shift signal output terminal CR <N+3> of the shift register unit at the following third stage, that is, the display reset signal may be a signal outputted from the shift signal output terminal CR <N+3> of the shift register unit at the following third stage.

As shown in FIG. 3, the global reset circuit 900 may be implemented as a sixteenth transistor M16. The control electrode of the sixteenth transistor M16 is coupled to the global reset signal terminal TRST to receive a global reset signal, the first electrode of the sixteenth transistor M16 is coupled to the pull-up node Q, and the second electrode of the sixteenth transistor M16 is coupled to the fifth voltage terminal VGL2 to receive the fifth voltage. For example, when a plurality of shift register units 10 are cascaded to form a gate driving circuit, before a display period of a frame, the sixteenth transistor M16 in the shift register unit 10 at each stage is turned on in response to the global reset signal, to reset the pull-up node Q by using the low-level fifth voltage, thereby achieving a global reset of the shift register unit 10 at each stage.

Figure 4:
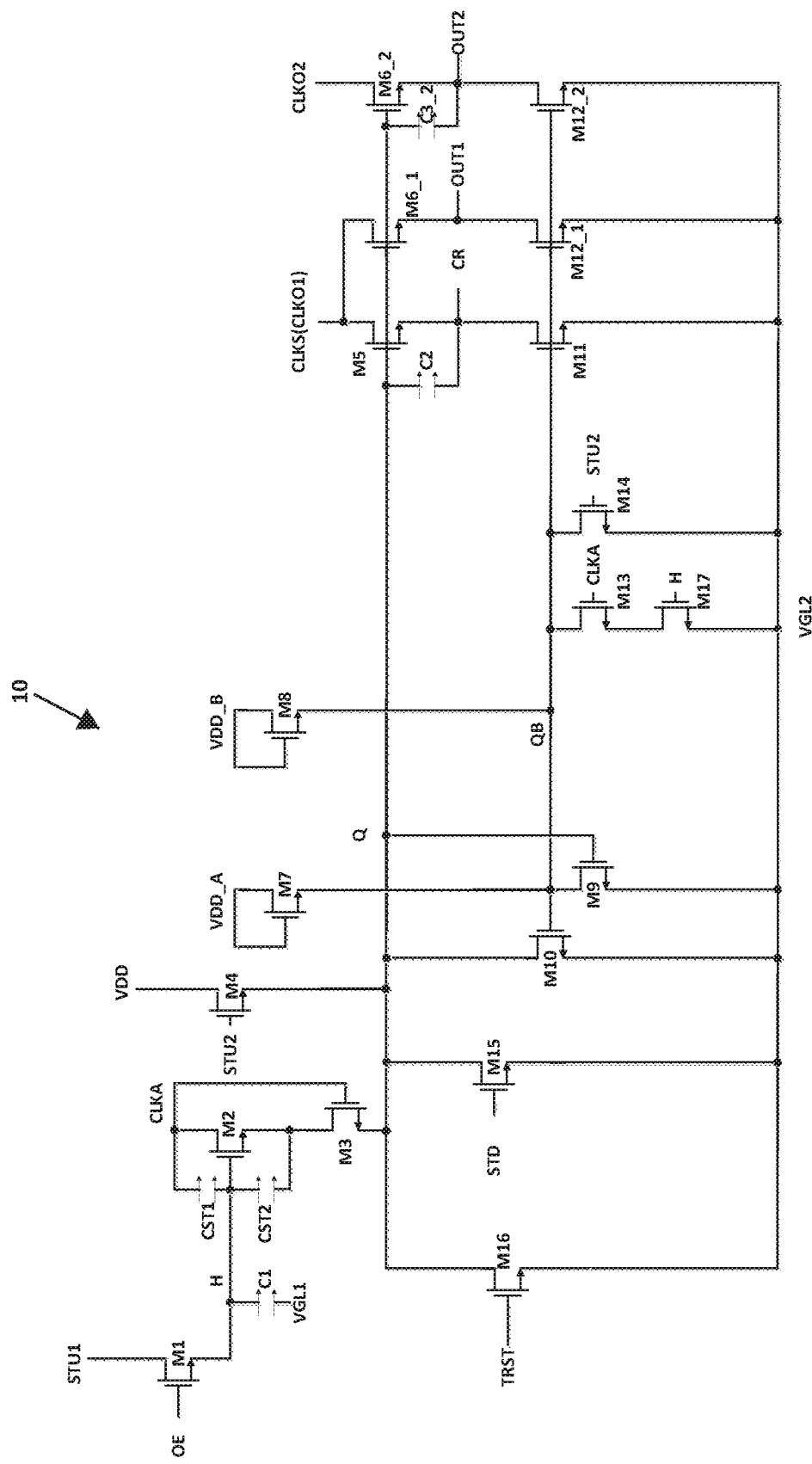
FIG. 4 is a circuit diagram of another shift register unit according to an embodiment of the present disclosure.

FIG. 4 is a circuit diagram of another shift register unit according to an embodiment of the present disclosure.

For example, in another example, as shown in FIG. 4, the blank pull-up holding circuit 130 may include a second coupling capacitor CST2 in addition to the first coupling capacitor CST1. The first electrode of the second coupling capacitor CST2 is coupled to the second electrode of the second transistor M2, and the second electrode of the second coupling capacitor CST2 is coupled to the pull-up control node H. For example, when the first clock signal changes from a low level to a high level, if the second transistor M2 is turned on at this time, the first clock signal at a high level may be transmitted to the first electrode of the second coupling capacitor CST2 through the second transistor M2 so that the potential of the first electrode of the second coupling capacitor CST2 is pulled up, and the level of the pull-up control node H may be further pulled up through the bootstrap effect.

For example, in another example, as shown in FIG. 4, the second pull-down control circuit 600 may further include a seventeenth transistor M17. The control electrode of the seventeenth transistor M17 is coupled to the pull-up control node H, the first electrode of the seventeenth transistor M17 is coupled to the second electrode of the thirteenth transistor M13, and the second electrode of the seventeenth transistor M17 is coupled to the fifth voltage terminal VGL2 to receive the fifth voltage.

For example, in a blank period of a frame, when the first clock signal and the pull-up control node H are both at a high level, the thirteenth transistor M13 and the seventeenth transistor M17 are both turned on, so that the pull-down node QB is coupled to the fifth voltage terminal VGL2 to pull down the pull-down node QB to a low level.

For example, in another example, as shown in FIG. 4, when the timings of the signals outputted from the plurality of output terminals are the same, the corresponding output sub-circuits may be coupled to the same clock signal terminal. For example, the shift signal output sub-circuit and the first pixel signal output sub-circuit may be coupled to the same clock signal terminal, which is represented by CLKS (CLKO1).

For example, in another example, as shown in FIG. 4, a third capacitor C3 may be further provided in the pixel signal output sub-circuit. The first electrode of the third capacitor C3 is coupled to the pull-up node Q and the second electrode of the third capacitor C3 is coupled to the second electrode of the sixth transistor M. For convenience of explanation, only the third capacitor C3 provided in the second pixel signal output sub-circuit 3002 is represented by C3_2 in the figure. However, it should be understood that the third capacitor C3 provided in the first pixel signal output sub-circuit 3001 may also be represented as C3_1 (not shown).

It should be noted that in the embodiment shown in FIG. 4, by providing the third capacitor C3, the capability of holding the level of the pull-up node Q may be improved. Of course, the third capacitor C3 may also not be provided. Embodiments of the present disclosure do not limit this.

For example, a plurality of shift register units 10 shown in FIG. 4 may be cascaded to form a gate driving circuit, and the gate driving circuit may implement random compensation. For example, in a blank period of a certain frame, external compensation is needed for the fifth row of sub-pixel units, and then the pull-up control node H in the corresponding fifth row of shift register units 10 is at a high level, so that the pull-down node QB in the shift register unit 10 is pulled down, thereby not affecting the output of the shift register unit 10. The pull-up control node H in the corresponding other row of shift register units 10 is at a low level, so that the pull-down node QB in the shift register unit 10 will not be pulled low to avoid the shift signal output terminal CR and the pixel signal output terminal OUT of other rows of shift register units 10 being in a floating state, thereby reducing the noise of the shift signal output terminal CR and the pixel signal output terminal OUT.

Figure 5A:
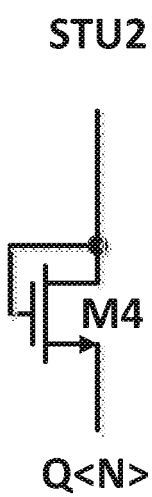
FIGS. 5A-5C show a plurality of examples of a display input circuit provided by an embodiment of the present disclosure.
Figure 5B:
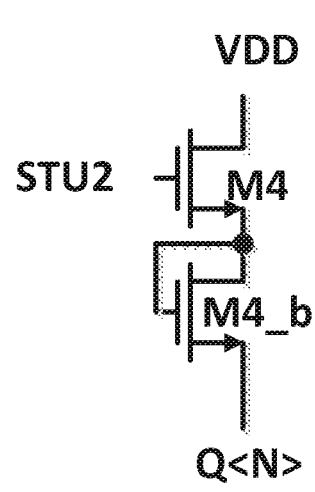
Figure 5C:
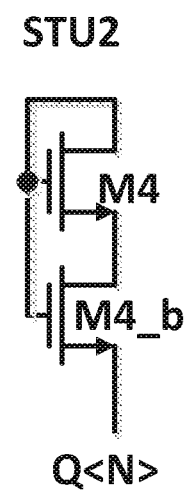

FIGS. 5A-5C show a plurality of examples of a display input circuit provided by an embodiment of the present disclosure.

For example, in one example, as shown in FIG. 5A, the control electrode and the first electrode of the fourth transistor M4 may be simultaneously coupled to the display input signal terminal STU2 (for example, CR <N–2> of the shift register unit at the preceding second stage), so that when the display input signal is at a high level, the pull-up node Q is charged by using the high-level display input signal.

As another example, as shown in FIG. 5B, in addition to the fourth transistor M4, the display input circuit 200 may include a transistor M4_b. The control electrode and the first electrode of the transistor M4_b are coupled to the second electrode of the fourth transistors M4, and the second electrode of the transistor M4_b is coupled to the pull-up node Q. Because the transistor M4_b adopts a diode coupling method, the current may only flow from the first electrode of the transistor M4_b to the second electrode, and cannot flow from the second electrode of the transistor M4_b (that is, the pull-up node Q) to the first electrode, thereby avoiding the leakage of the pull-up node Q through the fourth transistor M4.

As another example, in an example, as shown in FIG. 5C, the display input circuit 200 may include a transistor M4_b in addition to the fourth transistor M4. The control electrode of the transistor M4_b is coupled to the control electrode of the transistor M4. The first electrode of M4_b is coupled to the second electrode of the fourth transistor M4, and the second electrode of the transistor M4_b is coupled to the pull-up node Q. This may also prevent a leakage of the pull-up node Q through the fourth transistor M4.

Figure 6:
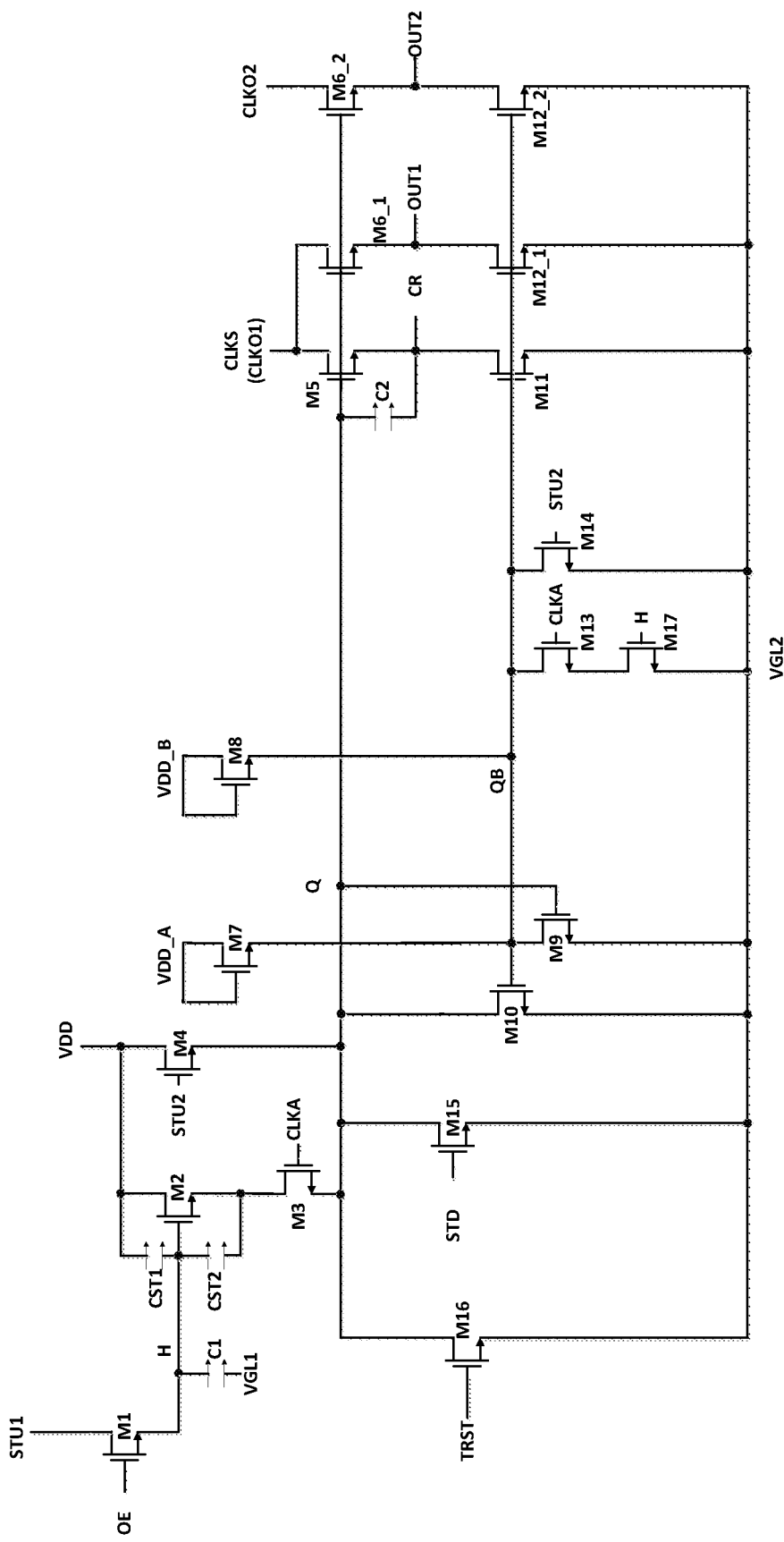
FIG. 6 is a circuit diagram of a shift register unit when a first electrode of a second transistor is coupled to a second voltage terminal.

FIG. 6 is a circuit diagram of the shift register unit when the first electrode of the second transistor is coupled to the second voltage terminal. For comparison, the first electrode of the second transistor M2 in the shift register unit 10 shown in FIG. 4 may be connected to the second voltage terminal VDD, so as to obtain the shift register unit shown in FIG. 6.

Figure 7A:
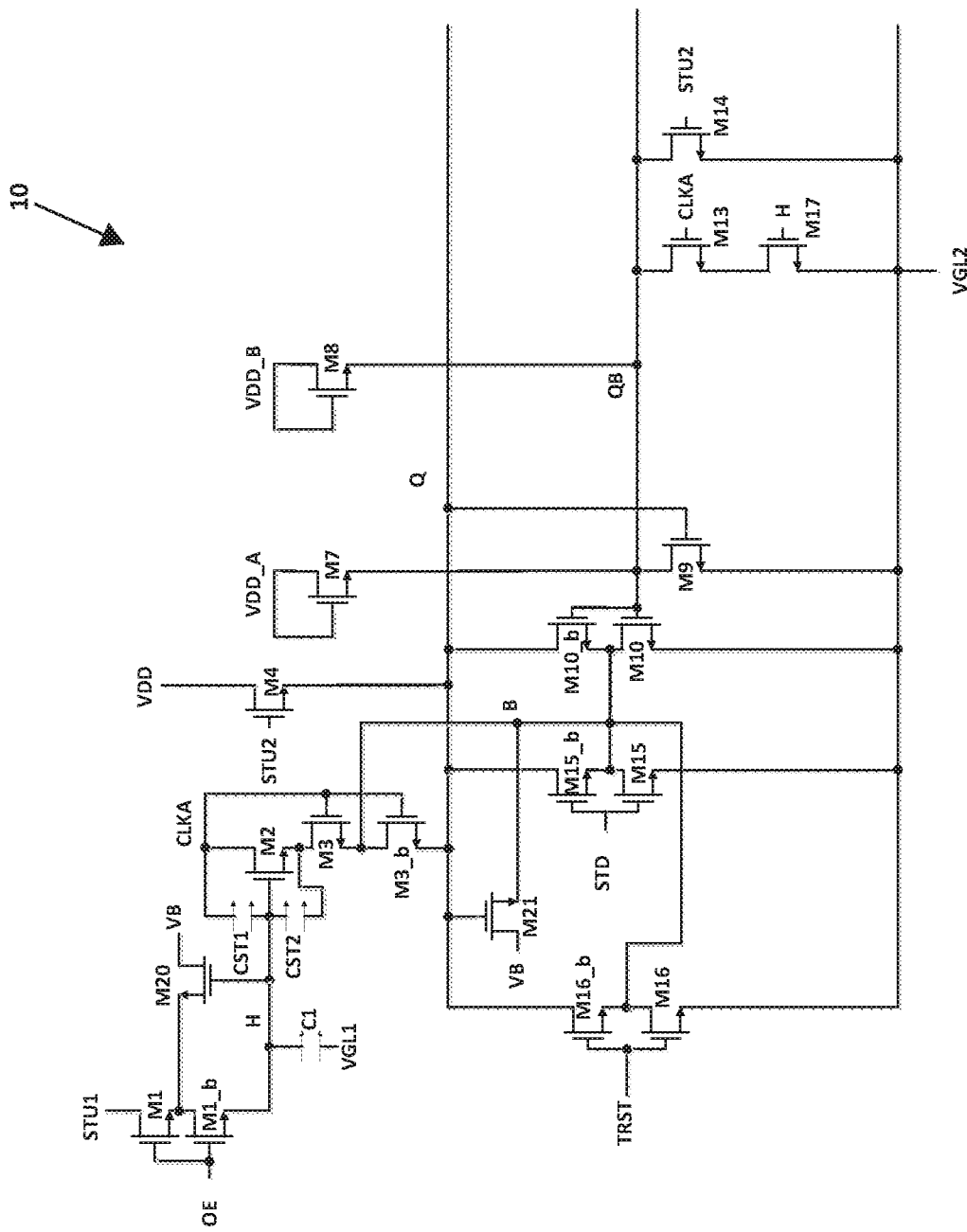
Figure 7B:
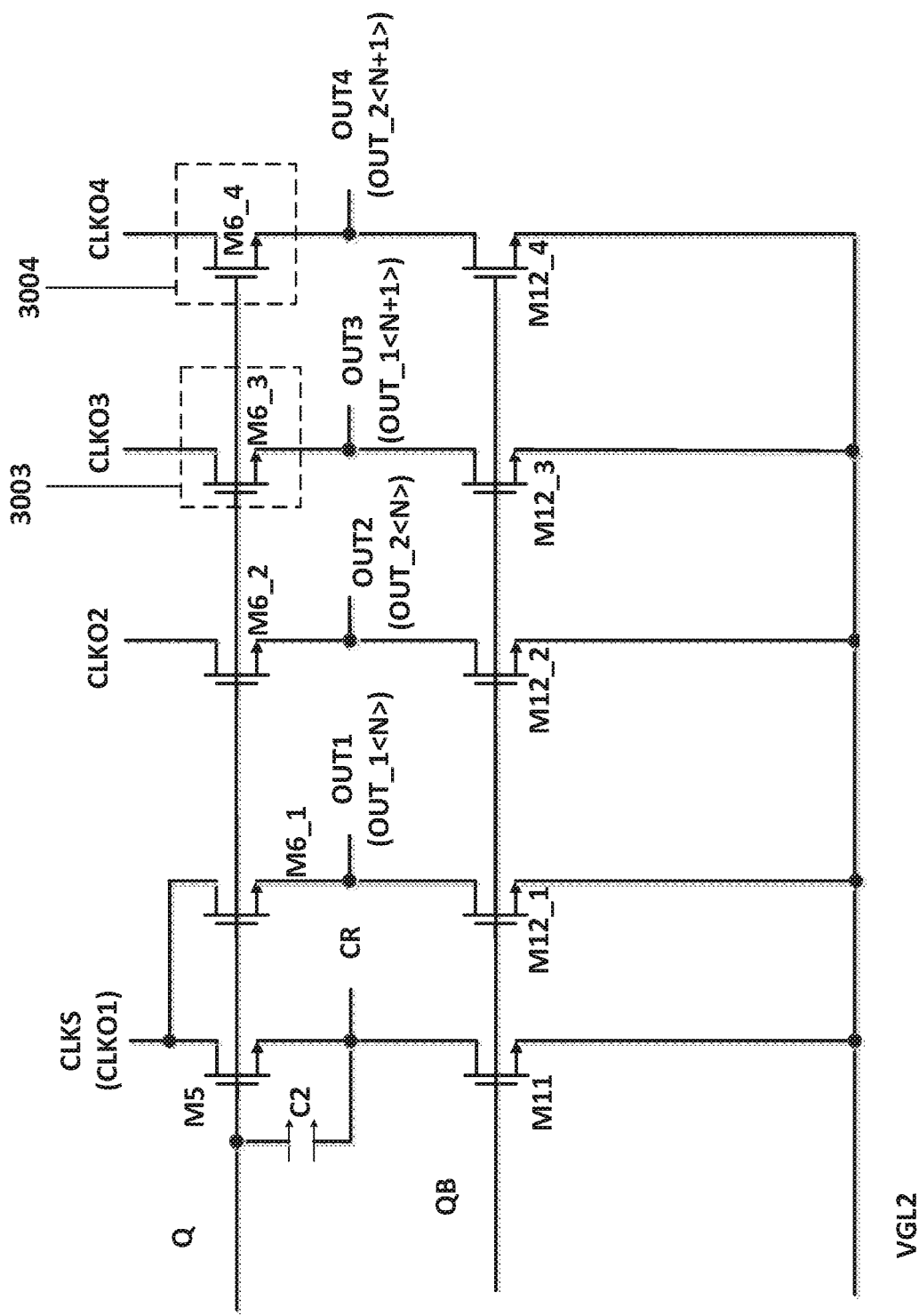

FIGS. 7A and 7B are circuit diagrams of still another shift register unit according to an embodiment of the present disclosure. FIG. 7A shows parts other than an output circuit 300 and a transistor for pulling it down, and FIG. 7B shows the output circuit 300 and the transistor for pulling it down.

As shown in FIGS. 7A and 7B, another embodiment of the present disclosure further provides a shift register unit 10. Comparing the shift register unit 10 shown in FIG. 7A, 7B with the shift register unit 10 shown in FIG. 4, the output circuit 300 further includes a transistor M6_3 belonging to the third pixel signal output sub-circuit 3003 and a transistor M6_4 belonging to the fourth pixel signal output sub-circuit 3004. Accordingly, the pull-down circuit 500 further includes transistors M12_3, M12_4. The connection mode of the transistor M6 of each pixel signal output sub-circuit is the same, and will not be described in detail.

The added pixel signal output sub-circuit provides more coupling ways to drive a plurality of rows of pixel units. For example, one row of pixel units may require two driving signals with different timings, which are represented by OUT_1 and OUT_2. The first pixel signal output sub-circuit 3001 and the second pixel signal output sub-circuit 3002 may sequentially output the driving signals of the Nth row, which are represented by OUT_1<N> and OUT_2<N>. Then, the third pixel signal output sub-circuit 3003 and the fourth pixel signal output sub-circuit 3004 may sequentially output the driving signals of the N+1th row, which are represented by OUT_1<N+1> and OUT_2<N+2>.

The shift register unit 10 may be used to drive a plurality of rows of pixel units, thus reducing the required occupied space.

Although the above only shows an example in which the shift register unit drives two rows of pixel units, those skilled in the art may understand that according to the description of the present disclosure, more pixel units may be driven according to the actual situation. The above example should not limit the protection scope of the present disclosure.

As described above, in the shift register unit 10 provided by the embodiment of the present disclosure, the potential at the pull-up control node H may be held by using the first capacitor C1, and the potential at the pull-up node Q may be held by using the second capacitor C2. The first capacitor C1 and/or the second capacitor C2 may be a capacitor device manufactured through a process procedure, for example, a capacitor device is realized by manufacturing special capacitor electrodes, and each electrode of the capacitor may be implemented by a metal layer, a semiconductor layer (for example, doped polysilicon) and the like, or the first capacitor C1 and/or the second capacitor C2 may also be implemented by parasitic capacitance between the various devices. The coupling method of the first capacitor C1 and/or the second capacitor C2 is not limited to the method described above, and may also be another applicable coupling method, as long as it may store the electric level written into the pull-up control node H or the pull-up node Q.

When the potential of the pull-up node Q and/or the pull-up control node H is held at a high level, the first electrodes of some transistors (for example, the first transistor M1, the third transistor M3, the tenth transistor M10, the fifteenth transistor M15, and the sixteenth transistor M16) are coupled to the pull-up node Q or the pull-up control node H, and the second electrodes thereof are coupled to a low-level signal. Even when a non-conducting signal is inputted to the control electrodes of these transistors, a leakage may occur due to a voltage difference between the first and second electrodes of the transistors, so that the effect of holding the potential of the pull-up node Q and/or the pull-up control node H in the shift register unit 10 becomes worse.

For example, as shown in FIG. 4, taking the pull-up control node H as an example, the first electrode of the first transistor M1 is coupled to the blank input signal terminal STU1, and the second electrode of the first transistor M is coupled to the pull-up control node H. When the pull-up control node H is at a high level and the signal inputted at the blank input signal terminal STU1 is at a low level, the pull-up control node H may leak electricity through the first transistor M1.

In view of the above problem, as shown in FIGS. 7A and 7B, the shift register unit 10 also has a leakage prevention structure. The shift register unit 10 is different from the shift register unit 10 in FIG. 4 in that a first leakage prevention transistor M1_b, a third leakage prevention transistor M3_b, a tenth leakage prevention transistor M10_b, a fifteenth leakage prevention transistor M15_b, a sixteenth leakage prevention transistor M16_b, a twentieth transistor M20, and a twenty-first transistor M21 are added. The working principle of leakage prevention will be described below using the first leakage prevention transistor M1_b as an example.

The control electrode of the first leakage prevention transistor M1_b is coupled to the control electrode of the first transistor M1, the first electrode of the first leakage prevention transistor M1_b is coupled to the second electrode of the twentieth transistor M20, and the second electrode of the first leakage prevention transistor M1_b is coupled to the pull-up control node H. The control electrode of the twentieth transistor M20 is coupled to the pull-up control node H, and the first electrode of the twentieth transistor M20 is coupled to the seventh voltage terminal VB to receive a high-level seventh voltage. When the pull-up control node H is at a high level, the twentieth transistor M20 is turned on under the control of the level of the pull-up control node H, so that the high level inputted from the seventh voltage terminal VB may be inputted to the first electrode of the first leakage prevention transistor M1_b so as to make the first and second electrodes of the first leakage prevention transistor M1_b be at a high level, so that the charge at the pull-up control node H may be prevented from leaking through the first leakage prevention transistor M1_b. At this time, since the control electrode of the first leakage prevention transistor M1_b is coupled to the control electrode of the first transistor M1, the combination of the first transistor M1 and the first leakage prevention transistor M1_b may achieve the same effect as the aforementioned first transistor M1 and also achieve the effect of leakage prevention.

Similarly, the third leakage prevention transistor M3_b, the tenth leakage prevention transistor M10_b, the fifteenth leakage prevention transistor M15_b, and the sixteenth leakage prevention transistor M16_b may be combined with the twenty-first transistor M21 respectively to implement a leakage prevention structure, thereby avoiding a leakage of the pull-up node Q. The working principle of preventing leakage of the pull-up node Q is the same as the above-mentioned working principle of preventing leakage of the pull-up control node H. When the Q point is at a high level, M21 is turned on, and the high level of VB is communicated to node B, that is, the first or second electrode of M3_b, M10_b, M15_b, and M16_b to prevent leakage.

Figure 8A:
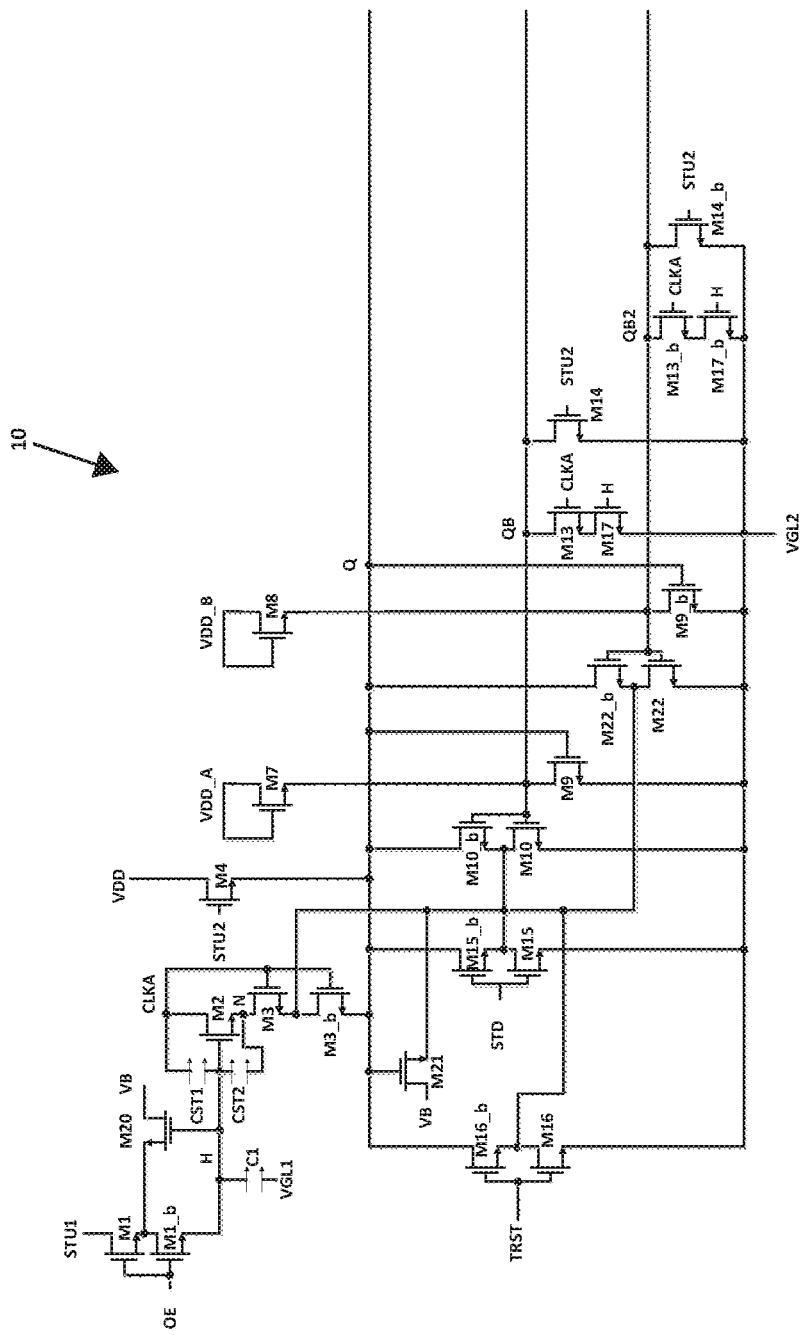
Figure 8B:
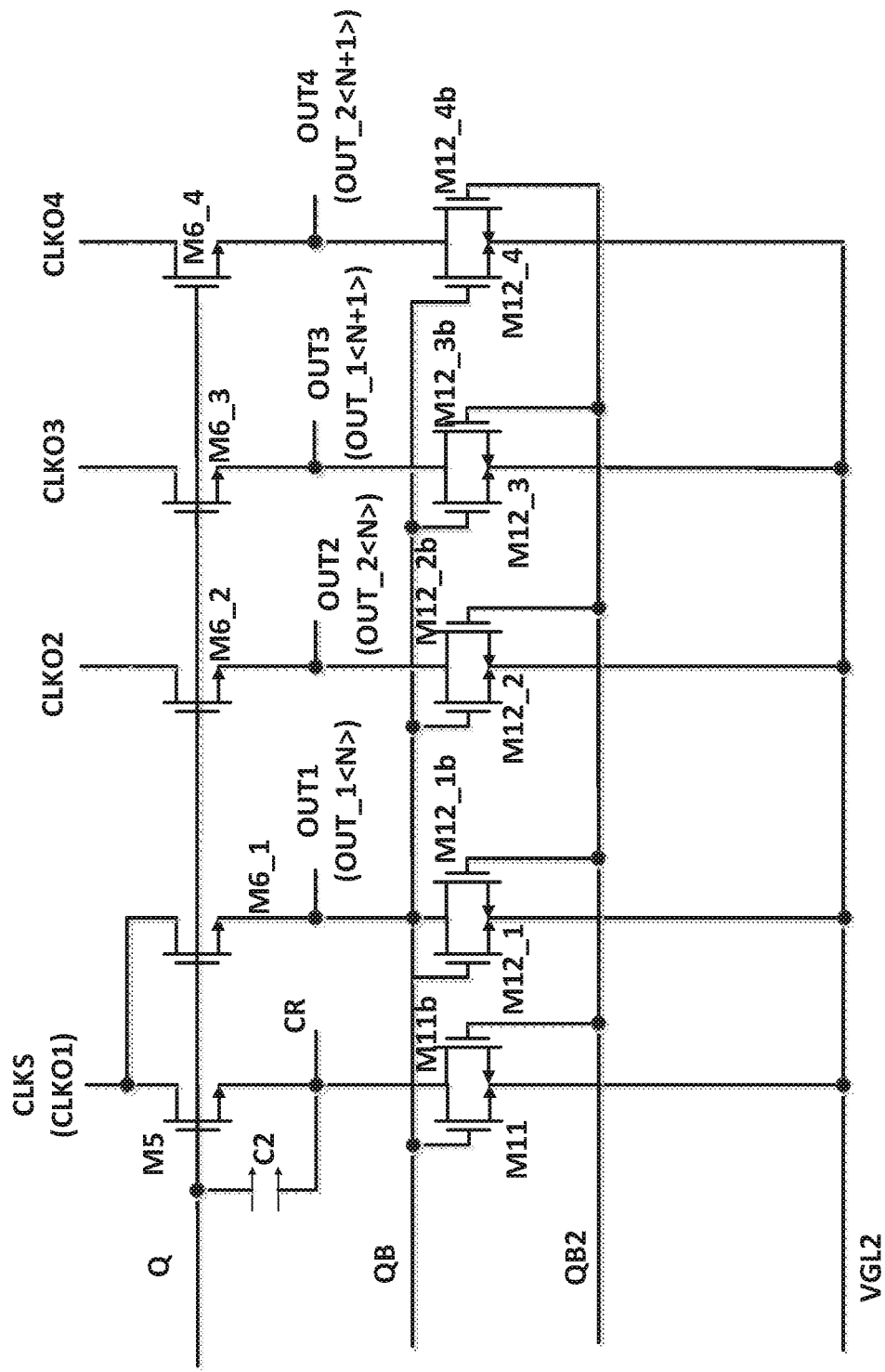

FIGS. 8A and 8B are circuit diagrams of still another shift register unit according to an embodiment of the present disclosure. FIG. 8A shows parts other than an output circuit 300 and a transistor for pulling it down, and FIG. 8B shows the output circuit 300 and the transistor for pulling it down.

As shown in FIGS. 8A and 8B, another embodiment of the present disclosure further provides a shift register unit 10. Compared with the shift register unit 10 shown in FIGS. 7A and 7B, a pull-down node QB2 is added in the shift register unit 10 shown in FIGS. 8A and 8B. In terms of difference, QB may also be referred to as the first pull-down node and QB2 may also be referred to as the second pull-down node; in order to work with the second pull-down node QB2, the transistors M22, M22_b, M9_b, M13_b, M17_b, M14_b, M11_b, and M12_b are added accordingly. It should be noted that the second electrode of the eighth transistor M8 is no longer coupled to the pull-down node QB, but is coupled to the second pull-down node QB2; the transistor M22_b is a leakage prevention transistor provided to prevent leakage of the pull-up node Q.

In the shift register unit shown in FIGS. 8A and 8B, the working principles of the transistors M22, M22_b, and M9_b are similar to those of the transistors M10, M10_b, and M9, respectively; the working principles of the transistors M13_b, M17_b, and M14_b are similar to those of the transistor M13, M17 and M14; the working principles of the transistors M11_b and M12_b are similar to those of the transistors M11 and M12, respectively, and are not repeated here. In the first pixel signal output sub-circuit 3001, M12_1b corresponds to M12_1, in the second pixel signal output sub-circuit 3002, M12_2b corresponds to M12_2, in the third pixel signal output sub-circuit 3003, M12_3b corresponds to M12_3, and in the fourth pixel signal output sub-circuit 3004, M12_4b corresponds to M12_4.

In the shift register unit 10 provided by the embodiment of the present disclosure, by setting a second pull-down node QB2 and a corresponding transistor, the performance of the shift register unit 10 may be further improved. For example, when the pull-up node Q is charged, the pull-down node Q and the second pull-down node QB may be at a low level enhancedly, so as not to affect the pull-up node Q, so that the pull-up node Q is sufficiently charged. For another example, when the shift register unit 10 does not need an output, the noise of the pull-up node Q and the output terminals (CR, OUT, OUT2) may be further reduced to avoid output abnormalities.

It should be noted that all the transistors used in the embodiments of the present disclosure may be thin film transistors or field effect transistors or other switching devices with the same characteristics. All the embodiments of the present disclosure are described using thin film transistors as an example. The control electrode of the transistor used here may be a gate, and the source and the drain may be symmetrical in structure, so there may be no difference in the structure of the source and the drain. In the embodiments of the present disclosure, in order to distinguish the two electrodes of the transistor other than the control electrode, one of the both is directly described as the first electrode and the other as the second electrode. In addition, transistors may be classified into N-type and P-type transistors according to the characteristics of the transistors. When the transistor is a P-type transistor, the turn-on voltage is a low-level voltage (for example, 0V, −5V, −10V, or another suitable voltage), and the turn-off voltage is a high-level voltage (for example, 5V, 10V, or another suitable voltage); when the transistor is an N-type transistor, the turn-on voltage is a high-level voltage (for example, 5V, 10V, or another suitable voltage), and the turn-off voltage is a low-level voltage (for example, 0V, −5V, −10V, or another suitable voltage).

In addition, it should be noted that the transistors used in the shift register unit 10 provided in the embodiments of the present disclosure are all described by taking N-type transistors as examples. The embodiments of the present disclosure include, but are not limited to these. For example, at least a part of the transistors in the shift register unit 10 may also be P-type transistors. After replacing with P-type transistors, it is only necessary to change the level of the corresponding control voltage applied to the control electrode. For example, changing the high level of the original N-type transistors to the low level of the P-type transistors may achieve the same control timing and function.

FIGS. 9A-9F show a plurality of examples of a blank input circuit and a blank pull-up circuit according to an embodiment of the present disclosure. In these examples, it is shown that the second electrode of the first capacitor C1 may be coupled to another low-level voltage terminal VA.

Figure 9A:
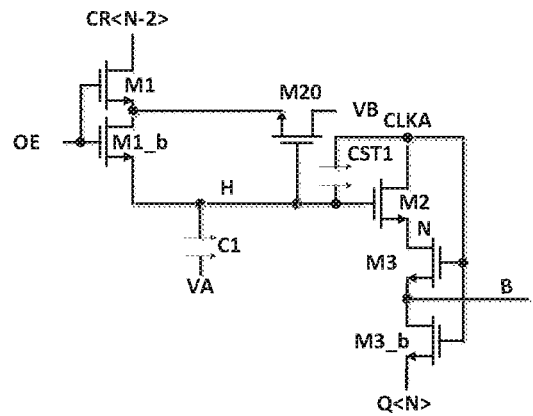
FIGS. 9A-9F show a plurality of examples of a blank input circuit and a blank pull-up circuit according to an embodiment of the present disclosure.
Figure 9B:
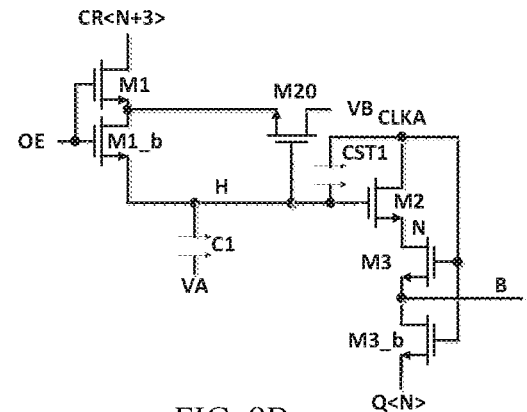
Figure 9C:
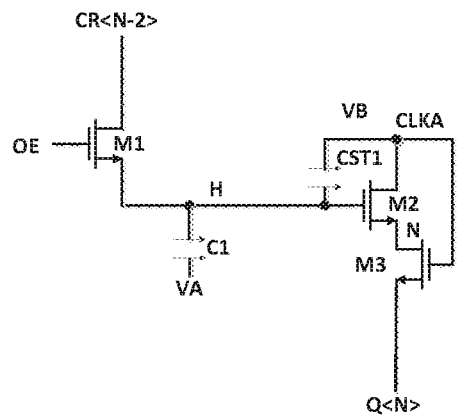
Figure 9D:
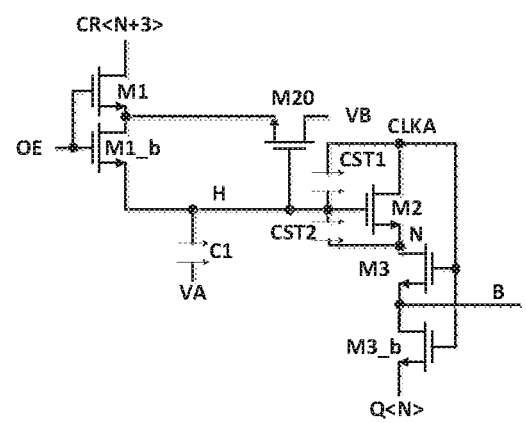
Figure 9E:
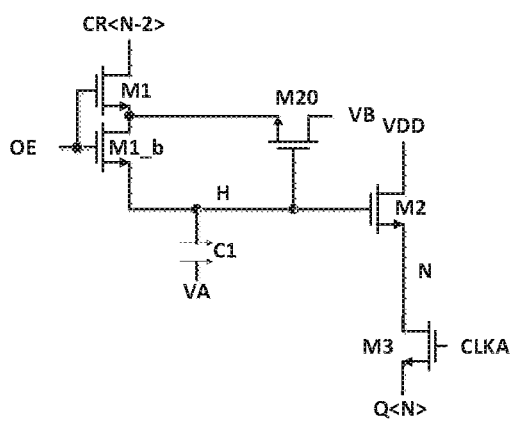
Figure 9F:
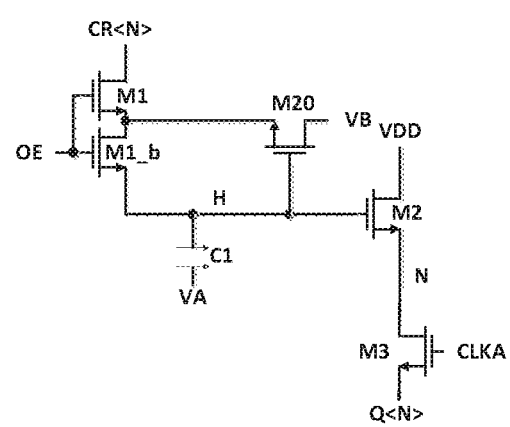

In FIGS. 9A-9E, it is shown that the blank signal terminal STU1 may be coupled to the shift signal output terminal CR <N−2> of the shift register unit at the preceding second stage. In FIGS. 9B and 9D, it is shown that the blank signal terminal STU1 may be coupled to the shift signal output terminal CR <N+3> of the shift register unit 10 at the following third stage. In FIG. 9F, it is shown that the blank signal terminal STU1 may be coupled to the shift signal output terminal CR <N> of the shift register unit 10 at the present stage.

In FIGS. 9A-9C, a blank pull-up holding circuit including a first coupling capacitor CST1 is shown. In FIG. 9D, a blank pull-up holding circuit including a first coupling capacitor CST1 and a second coupling capacitor CST2 is shown. FIGS. 9E and 9F show a case where no blank pull-up holding circuit is included.

In FIGS. 9A, 9B, and 9D, a leakage prevention structure is shown, including a first leakage prevention transistor M1_b, a third leakage prevention transistor M3_b, and a twentieth transistor M20. In FIGS. 9E and 9F, a leakage prevention structure is shown, including a first leakage prevention transistor M1_b and a twentieth transistor M20. FIG. 9C shows a case where no leakage prevention structure is included.

It should be understood that based on the structured circuit settings, such as shown in FIGS. 9A-9F, the specific settings of the various circuit parts may be adjusted, and the effects of the present disclosure may also be achieved. The scope of the present disclosure includes various specific setting adjustments made based on the basic principles of the present disclosure.

Figure 10A:
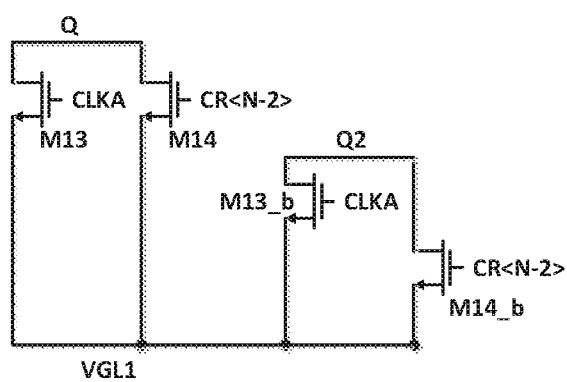
FIGS. 10A and 10B show a plurality of examples of a pull-down control circuit provided by an embodiment of the present disclosure.
Figure 10B:
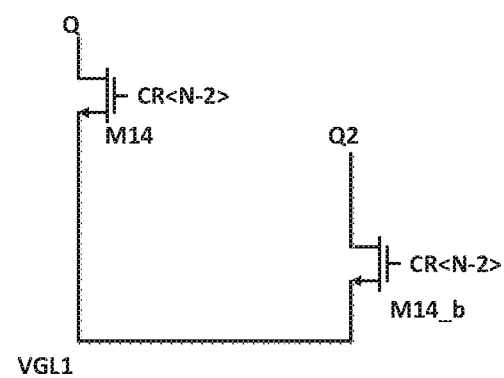

FIGS. 10A and 10B show a plurality of examples of the second pull-down control circuit and the third pull-down control circuit provided by the embodiment of the present disclosure. For comparison with FIG. 3, for the first pull-down node QB, the setting in FIG. 10A is the same. In FIG. 10A, M13_b and M14_b are added to work with the second pull-down node QB2. In FIG. 10B, as compared with FIG. 10A, only the transistors M14 and M14_b are used, and the use of the transistors M13 and M13_b is reduced.

Figure 11:
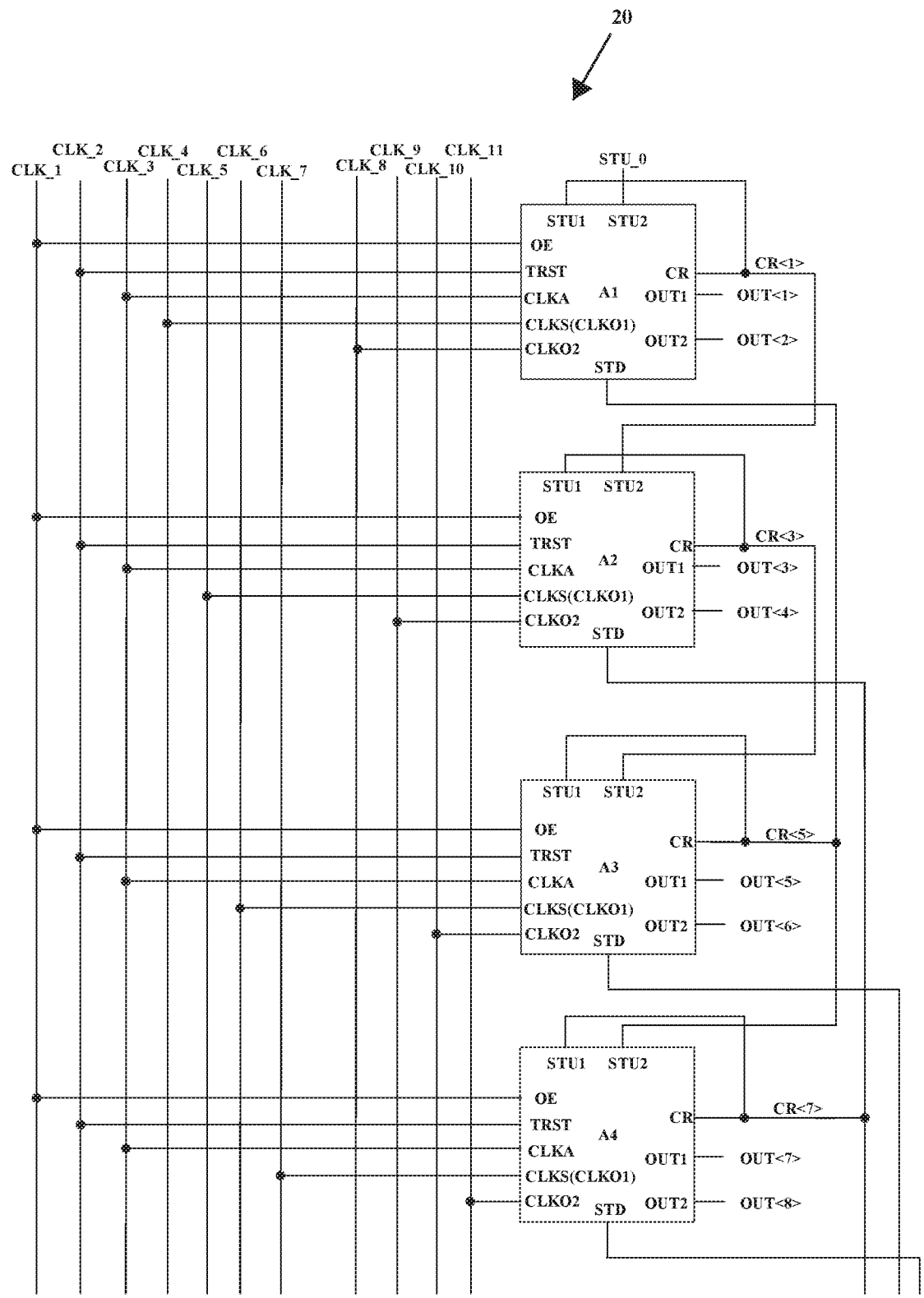
FIG. 11 is a schematic diagram of a gate driving circuit according to an embodiment of the present disclosure.

FIG. 11 is a schematic diagram of a gate driving circuit according to an embodiment of the present disclosure. An embodiment of the present disclosure provides a gate driving circuit 20. As shown in FIG. 11, the gate driving circuit 20 includes a plurality of cascaded shift register units 10, in which any one or more shift register units 10 may adopt the structure of the shift register unit 10 provided by the embodiments of the present disclosure or a variant thereof. It should be noted that FIGS. 10A and 10B only schematically illustrates the first four shift register units (A1, A2, A3, and A4) of the gate driving circuit 20, and the embodiments of the present disclosure include but are not limited thereto. For example, depending on the timing, subsequent structures may be completely identical repeated structures.

The relationship between the serial number of the stage at which a shift register unit is located and the serial number of the row at which a pixel unit is located is as follows: the shift register unit at the Mth stage outputs the signals of the 2M−1th row of pixel units and the signals of the 2Mth row of pixel units. The shift signal output terminal CR of the shift register unit at the Mth stage is coupled to the display input signal terminal STU2 of the shift register unit at the M+1th stage. The display reset signal terminal STD of the shift register unit at the Mth stage is coupled to the shift signal output terminal CR of the shift register unit at the M+2th stage. M is an integer greater than zero.

The display input signal terminal STU2 of the first-stage shift register unit is directly coupled to an initial display signal terminal STU_0. The blank input signal terminal STU1 of the shift register unit at each stage is coupled to its own shift signal output terminal CR.

It should be understood that, in order to better represent the relationship between the shift register unit and the row of the pixel unit being driven, the mark of the shift signal outputted by the shift signal output terminal CR corresponds to the mark of the pixel signal outputted by the pixel signal output terminal, instead of corresponding to the serial number of the stage at which the shift register unit is located. That is, the shift signal outputted by the second-stage shift register unit A2 is marked as CR <3>, which corresponds to the pixel signal OUT <3> of the pixel unit of the third row that it outputs, instead of corresponding to the serial number 2 of the stage at which the shift register unit A2 is located.

As shown in FIG. 11, the gate driving circuit 20 further includes a first sub clock signal line CLK_1, a second sub clock signal line CLK_2, and a third sub clock signal line CLK_3. The first sub clock signal line CLK_1 is coupled to the compensation selection control terminal OE of each shift register unit, the second sub clock signal line CLK_2 is coupled to the global reset signal terminal TRST of each shift register unit, and the third sub clock signal line CLK_3 is coupled to the first clock signal terminal CLKA of each shift register unit.

The gate driving circuit 20 further includes a fourth sub clock signal line CLK_1, a fifth sub clock signal line CLK_5, a sixth sub clock signal line CLK_6, and a seventh sub clock signal line CLK_7, which are respectively coupled to the shift clock signal terminals CLKS (the first pixel clock signal terminal CLKO1) of the first-stage shift register unit A1, the second-stage shift register unit A2, the third-stage shift register unit A3, and the fourth-stage shift register unit A4 for outputting a shift signal and a first pixel signal.

The gate driving circuit 20 further includes an eighth sub clock signal line CLK_8, a ninth sub clock signal line CLK_9, a tenth sub clock signal line CLK_10, and an eleventh sub clock signal line CLK_11, which are respectively coupled to the second pixel clock signal terminals CLKO2 of the first-stage shift register unit A1, the second-stage shift register unit A2, the third-stage shift register unit A3, and the fourth-stage shift register unit A4 for outputting a second pixel signal.

It should be noted that the cascading relationship shown in FIG. 11 is only an example. According to the description of the present disclosure, other cascading manners may also be adopted according to the actual situation. For example, as previously described, the blank input signal terminal STU1 of the shift register unit at each stage may also be selectively coupled to the shift signal output terminal CR of the shift register unit at the preceding second stage or at the following third stage.

An embodiment of the present disclosure further provides a driving method of a shift register unit according to any one of the preceding, including in a display period of a frame, outputting the shift signal to another shift register unit through the shift signal output terminal, and in a display period of a frame, outputting a plurality of pixel signals respectively to a plurality of rows of pixel units through the plurality of pixel signal output terminals. The plurality of pixel signals include a plurality of display output signals.

In an embodiment of the present disclosure, in a display period of a frame, the plurality of pixel clock signals are respectively inputted into the plurality of pixel signal output sub-circuits based on a display timing of the plurality of rows of pixel units. In a display period of a frame, the plurality of pixel signal output sub-circuits respectively output a plurality of output clock signals to a plurality of output terminals under the control of the plurality of output clock signals, as a plurality of display output signals. The display timing is a row scan display timing that causes each row of the plurality of rows of pixel units to be displayed in sequence.

In an embodiment of the present disclosure, the driving method of the shift register unit further includes in a display period of a frame, the blank input circuit charging the pull-up control node in response to the compensation selection control signal and holding the level of the pull-up control node; in a blank period of a frame, the blank pull-up circuit using the first clock signal to charge the pull-up node under the control of the level of the pull-up control node and the first clock signal, in a blank period of a frame, a blank pull-up holding circuit pulling up and holding the pull-up control node in response to the first clock signal; in a blank period of a frame, one of the plurality of pixel signal output terminals outputting a pixel signal to one of the plurality of rows of pixel units, wherein the pixel signal includes a blank output signal.

In an embodiment of the present disclosure, one of the plurality of pixel clock signals is inputted into one of the plurality of pixel signal output sub-circuits in a blank period of a frame. In a blank period of a frame, one of the plurality of pixel signal output sub-circuits outputs one of the plurality of output clock signals to one of the plurality of output terminals under the control of one of the plurality of pixel clock signals, as a blank output signal.

Hereinafter, the above driving method will be further described with reference to the accompanying drawings.

Figure 12:
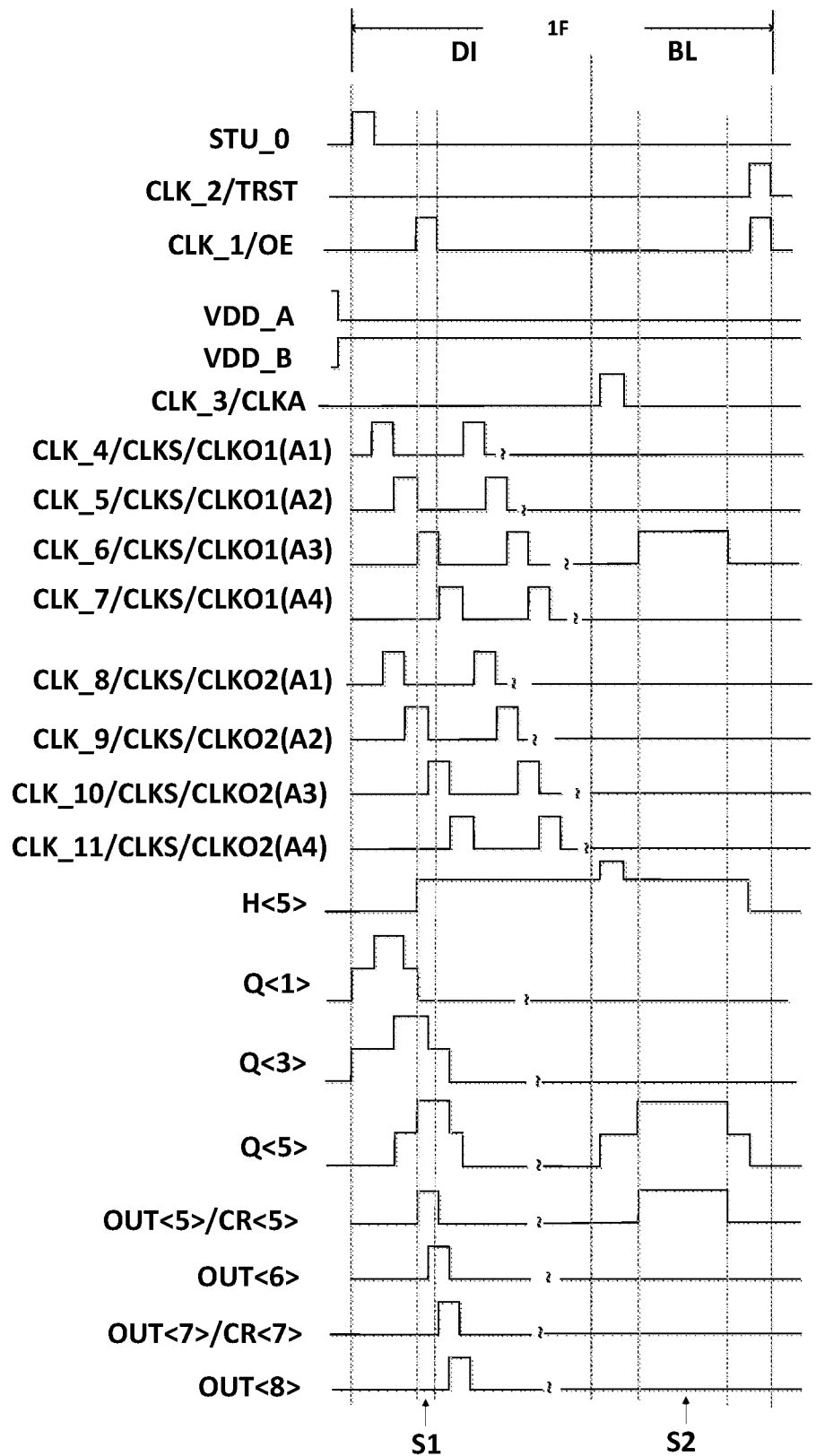
FIG. 12 is a timing diagram of the gate driving circuit of FIG. 11.

FIG. 12 is a timing diagram of the gate driving circuit of FIG. 11. In FIG. 12, H <5> represents the pull-up control node H in the third-stage shift register unit A3 in the gate driving circuit 20, and Q <1>, Q <3>, and Q <5> respectively represent the pull-up node Q in the first-stage shift register unit A1, the second-stage shift register unit A2, and the third-stage shift register unit A3 in the gate driving circuit 20. OUT <5> (CR <5>) and OUT <6> represent the first pixel signal output terminal OUT1 (shift signal output terminal CR) and the second pixel signal output terminal OUT2 of the third-stage shift register unit A3 in the gate driving circuit 20. OUT <7> (CR <7>) and OUT <8> respectively represent the first pixel signal output terminal OUT1 (shift signal output terminal CR) and the second pixel signal output terminal OUT2 of the fourth-stage shift register unit A4 in the gate driving circuit 20. 1F represents the first frame, DI represents the display period in the first frame, and BL represents the blank period in the first frame.

In addition, it should be noted that, in FIG. 12, the third voltage terminal VDD_A is inputted with a low level and the fourth voltage terminal VDD_B is inputted with a high level as an example, but the embodiment of the present disclosure is not limited thereto. The signal levels in the signal timing diagram shown in FIG. 12 are only schematic and do not represent true level values.

The following describes the working principle of the gate driving circuit 20 shown in FIG. 11 with reference to the signal timing diagram in FIG. 12. For example, the shift register unit in the gate driving circuit 20 shown in FIG. 11 may use the shift register unit shown in FIG. 4.

Taking the operation of the first-stage shift register unit A1 as an example to describe the display signal output and referring to FIG. 4, firstly, the display input signal terminal STU2 of the first-stage shift register unit receives a signal from the initial display signal terminal STU_0, the fourth transistor M4 is turned on, and the high-level voltage from the second voltage terminal VDD is inputted to the pull-up node Q. The pull-up node Q <1> of the first-stage shift register unit A1 becomes a high level. While the pull-up node Q <1> is at a high level, firstly, the shift clock signal terminal CLKS (the first pixel clock signal terminal CLKO1) receives a high-level clock signal from the fourth sub clock signal line CLK_4, so that the shift signal output terminal CR <1> and the first pixel signal output terminal OUT1 (OUT <1>) of the first-stage shift register unit A1 output high-level display output signals (not shown). Then, the second pixel clock signal terminal CLKO2 receives a high-level clock signal from the eighth sub clock signal line CLK_8, so that the second pixel signal output terminal OUT2 (OUT <2>) of the first-stage shift register unit A1 outputs a high-level display output signal (not shown). The shift signal outputted from the shift signal output terminal CR <1> is inputted to the display input signal terminal STU2 of the second-stage shift register unit A2, the second-stage shift register unit A2 repeats the above process, and then the third-stage shift register unit A3 repeats the above process. The shift signal outputted from the shift signal output terminal CR <5> of the third-stage shift register unit A3 is inputted to the display reset signal terminal STD of the first-stage shift register unit A1, and the fifteenth transistor M15 is turned on, so that pull-up node Q <1> becomes a low level.

In addition, the operation of the third-stage shift register unit A3 is taken as an example to explain the blank signal output. The blank signal is outputted from the first pixel signal output terminal OUT1 (OUT <5>) of the third-stage shift register unit A3 to the fifth row of pixel units. Referring to FIG. 4 at the same time, as shown by S1 in FIG. 12, when the shift signal output terminal CR <5> of the third-stage shift register unit A3 outputs a high-level signal, the compensation selection control terminal OE of the third-stage shift register unit A3 receives a high-level clock signal from the first sub clock signal line CLK_1, the first transistor M1 is turned on, the pull-up control node H <5> becomes a high level, and the second transistor M2 is turned on. The high level of the pull-up control node H <5> is held until the blank period BL. In the blank period, the first clock signal terminal CLKA of the third-stage shift register unit A3 receives a high-level clock signal from the third sub clock signal line CLK_3, and the third transistor M3 is turned on, so that the pull-up node Q becomes a high level, and the fifth transistor M5 is turned on. Subsequently, the shift clock signal terminal CLKS (the first pixel clock signal terminal CLKO1) of the third-stage shift register unit A3 receives a high-level signal from the sixth sub clock signal line CLK_6, so that the shift signal output terminal CR <5> (the first pixel signal output terminal OUT1) of the third-stage shift register unit A3 outputs a high-level blank output signal. This stage is shown as S2 in FIG. 12. In the S2 stage where the high-level blank output signal is outputted, the signal of the third sub clock signal line CLK_3 becomes a low level and cannot charge the pull-up node Q <5> through the third transistor M3 any longer. However, once the transistor M5 is turned on, due to the bootstrapping effect of the second capacitor C2, Q <5> may also be held at a high level.

After the blank output signal is outputted, the first sub clock signal line CLK_1 and the second sub clock signal line CLK_2 have high-level signals. Since the compensation selection control terminal OE of the shift register unit at each stage is coupled to the first sub clock signal line CLK_1 and the global reset signal terminal TRST of the shift register unit at each stage is coupled to the second sub clock signal line CLK_2, the pull-up control node H and the pull-up node Q in the shift register unit at each stage may be reset, so that the pull-up control node H <5> and the pull-up node Q <5> are all reset.

So far, the driving timing of the first frame ends. For subsequent driving of the gate driving circuit in the second frame, the third frame, and the like, reference may be made to the foregoing description, and details are not described herein again.

It should be noted that, in the above description of the working principle of the random compensation, the driving signal corresponding to the fifth row of sub-pixel units of the display panel is outputted as an example in the blank period of the first frame, and there is no limitation thereto in the present disclosure. For example, when driving signals corresponding to other sub-pixel units of the display panel need to be outputted in the blank period of a certain frame, it is necessary to control such that the signal provided to the compensation selection control terminal OE has the same timing as the signal of the blank input signal terminal STU1 of the corresponding shift register unit. It should be noted here that the same timing of two signals refers to time synchronization at a high level, without requiring the same amplitudes of the two signals.

As described above, by setting the blank pull-up holding circuit 130 to pull-up and hold the pull-up control node H, it is possible to avoid leakage of the pull-up control node H, thereby charging the pull-up node Q in the blank period of a frame more sufficiently to avoid output abnormalities. In addition, the shift register unit may also drive a plurality of rows of pixel units, reducing the number of shift register units and reducing the area required by the gate driving circuit.

Figure 13:
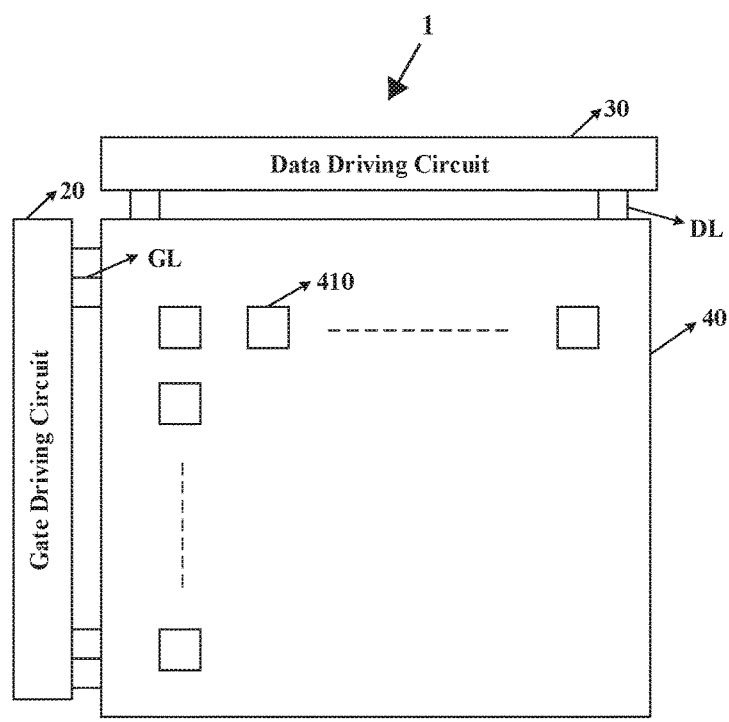
FIG. 13 is a schematic diagram of a display device according to an embodiment of the present disclosure.

FIG. 13 is a schematic diagram of a display device according to an embodiment of the present disclosure.

An embodiment of the present disclosure further provides a display device 1. As shown in FIG. 13, the display device 1 includes a gate driving circuit 20 provided by an embodiment of the present disclosure. The display device 1 further includes a display panel 40 including an array formed by a plurality of sub-pixel units 410. For example, the display device 1 may further include a data driving circuit 30. The data driving circuit 30 is used to provide a data signal to the pixel array; the gate driving circuit 20 is used to provide a driving signal to the pixel array, for example, the driving signal may drive the scanning transistor and the sensing transistor in the sub-pixel unit 410. The data driving circuit 30 is coupled to the sub-pixel unit 410 through a data line DL, and the gate driving circuit 20 is coupled to the sub-pixel unit 410 through a gate line GL.

It should be noted that the display device 1 in this embodiment may be any of products or parts with display capabilities, such as a liquid crystal panel, a liquid crystal television, a display, an OLED panel, an OLED television, an electronic paper display device, a mobile phone, a tablet computer, a notebook computer, a digital photo frame, and a navigator.

For technical effects of the display device 1 provided by the embodiments of the present disclosure, reference may be made to the corresponding descriptions of the gate driving circuit 20 in the foregoing embodiments, and details are not described herein again.

The above are only specific implementations of the present disclosure, but the scope of protection of the present disclosure is not limited thereto, and the scope of protection of the present disclosure shall be subject to the scope of protection of the claims.

What is claimed is:

1. A shift register unit comprising a blank input circuit, a blank pull-up circuit, a display input circuit, and an output circuit;
   wherein the blank input circuit is configured to charge a pull-up control node in response to a compensation selection control signal and hold the level of the pull-up control node;
   wherein the blank pull-up circuit is configured to charge a pull-up node by using a first clock signal under the control of the level of the pull-up control node and the first clock signal;
   wherein the display input circuit is configured to charge the pull-up node in response to a display input signal;
   wherein the output circuit is configured to output a plurality of output clock signals to a plurality of output terminals respectively under the control of the level of the pull-up node and the plurality of output clock signals;
   wherein the plurality of output terminals comprise a shift signal output terminal and a plurality of pixel signal output terminals; and
   wherein the plurality of pixel signal output terminals are configured to output a plurality of pixel signals to a plurality of rows of pixel units respectively.

2. The shift register unit according to claim 1, wherein the blank input circuit comprises a first transistor and a first capacitor;
   wherein a control electrode of the first transistor is coupled to a compensation selection control terminal to receive the compensation selection control signal, wherein a first electrode of the first transistor is coupled to a blank input signal terminal, and wherein a second electrode of the first transistor is coupled to the pull-up control node; and
   wherein a first electrode of the first capacitor is coupled to the pull-up control node, and wherein a second electrode of the first capacitor is coupled to a first voltage terminal.

3. The shift register unit according to claim 1, wherein the blank pull-up circuit comprises a second transistor and a third transistor;
   wherein a control electrode of the second transistor is coupled to the pull-up control node, wherein a first electrode of the second transistor is coupled to a first clock signal terminal to receive the first clock signal, and wherein a second electrode of the second transistor is coupled to a first electrode of the third transistor; and
   wherein a control electrode of the third transistor is coupled to the first clock signal terminal to receive the first clock signal, and wherein a second electrode of the third transistor is coupled to the pull-up node.

4. The shift register unit according to claim 3, further comprising a blank pull-up holding circuit;
   wherein the blank pull-up holding circuit is coupled to the pull-up control node and is configured to pull up and hold the pull-up control node in response to the first clock signal;

wherein the blank pull-up holding circuit comprises a first coupling capacitor; and wherein a first electrode of the first coupling capacitor is coupled to the first clock signal terminal to receive the first clock signal, and wherein a second electrode of the first coupling capacitor is coupled to the pull-up control node.

5. The shift register unit according to claim 4, wherein the blank pull-up holding circuit further comprises a second coupling capacitor;

wherein a first electrode of the second coupling capacitor is coupled to the second electrode of the second transistor, and wherein a second electrode of the second coupling capacitor is coupled to the pull-up control node.

6. The shift register unit according to claim 1, wherein the display input circuit comprises a fourth transistor;

wherein a control electrode of the fourth transistor is coupled to a display input signal terminal to receive the display input signal, wherein a first electrode of the fourth transistor is coupled to a second voltage terminal to receive a second voltage, and wherein a second electrode of the fourth transistor is coupled to the pull-up node.

7. The shift register unit according to claim 1, wherein the shift signal output sub-circuit comprises a fifth transistor, wherein a control electrode of the fifth transistor is coupled to the pull-up node, wherein a first electrode of the fifth transistor is coupled to a shift clock signal terminal to receive a shift clock signal, and wherein a second electrode of the fifth transistor is coupled to the shift signal output terminal; and wherein one of the plurality of pixel signal output sub-circuits comprises a sixth transistor, wherein a control electrode of the sixth transistor is coupled to the pull-up node, wherein a first electrode of the sixth transistor is coupled to one of a plurality of pixel clock signal terminals to receive one of the plurality of pixel clock signals, and wherein a second electrode of the sixth transistor is coupled to one of the plurality of pixel signal output terminals.

8. The shift register unit according to claim 1, further comprising a first pull-down control circuit and a pull-down circuit;

wherein the first pull-down control circuit is configured to control the level of a pull-down node under the control of the level of the pull-up node; and wherein the pull-down circuit is configured to pull-down and reset the pull-up node, the shift signal output terminal, and the plurality of pixel signal output terminals under the control of the level of the pull-down node.

9. The shift register unit according to claim 8, wherein the first pull-down control circuit comprises a seventh transistor, an eighth transistor, and a ninth transistor;

wherein a control electrode and a first electrode of the seventh transistor are coupled and are configured to be coupled to a third voltage terminal to receive a third voltage, and wherein a second electrode of the seventh transistor is coupled to the pull-down node;

wherein a control electrode and a first electrode of the eighth transistor are coupled and are configured to be coupled to a fourth voltage terminal to receive a fourth voltage, and wherein a second electrode of the eighth transistor is coupled to the pull-down node; and wherein a control electrode of the ninth transistor is coupled to the pull-up node, wherein a first electrode of the ninth transistor is coupled to the pull-down node, and wherein a second electrode of the ninth transistor is coupled to a fifth voltage terminal to receive a fifth voltage.

10. The shift register unit according to claim 8, wherein the pull-down circuit comprises a tenth transistor, an eleventh transistor, and a twelfth transistor;

wherein a control electrode of the tenth transistor is coupled to the pull-down node, wherein a first electrode of the tenth transistor is coupled to the pull-up node, and wherein a second electrode of the tenth transistor is coupled to a fifth voltage terminal to receive a fifth voltage;

wherein a control electrode of the eleventh transistor is coupled to the pull-down node, wherein a first electrode of the eleventh transistor is coupled to the shift signal output terminal, and wherein a second electrode of the eleventh transistor is coupled to the fifth voltage terminal to receive the fifth voltage; and wherein a control electrode of the twelfth transistor is coupled to the pull-down node, wherein a first electrode of the twelfth transistor is coupled to one of the plurality of pixel signal output terminals, and wherein a second electrode of the twelfth transistor is coupled to the fifth voltage terminal to receive the fifth voltage.

11. The shift register unit according to claim 8, further comprising a second pull-down control circuit and a third pull-down control circuit;

wherein the second pull-down control circuit is configured to control the level of the pull-down node in response to the first clock signal; and wherein the third pull-down control circuit is configured to control the level of the pull-down node in response to the display input signal.

12. The shift register unit according to claim 11, wherein the second pull-down control circuit comprises a thirteenth transistor, and wherein the third pull-down control circuit comprises a fourteenth transistor;

wherein a control electrode of the thirteenth transistor is coupled to a first clock signal terminal to receive the first clock signal, wherein a first electrode of the thirteenth transistor is coupled to the pull-down node, and wherein a second electrode of the thirteenth transistor is coupled to a fifth voltage terminal to receive a fifth voltage; and wherein a control electrode of the fourteenth transistor is coupled to a display input signal terminal to receive the display input signal, wherein a first electrode of the fourteenth transistor is coupled to the pull-down node, and wherein a second electrode of the fourteenth transistor is coupled to the fifth voltage terminal to receive the fifth voltage.

13. The shift register unit according to claim 11, wherein the second pull-down control circuit comprises a thirteenth transistor and a seventeenth transistor, and the third pull-down control circuit comprises a fourteenth transistor;

wherein a control electrode of the thirteenth transistor is coupled to a first clock signal terminal to receive the first clock signal, wherein a first electrode of the thirteenth transistor is coupled to the pull-down node, and wherein a second electrode of the thirteenth transistor is coupled to a first electrode of the seventeenth transistor;

wherein a control electrode of the seventeenth transistor is coupled to the pull-up control node, and wherein a second electrode of the seventeenth transistor is coupled to a fifth voltage terminal to receive a fifth voltage; and wherein a control electrode of the fourteenth transistor is coupled to a display input signal terminal to receive the display input signal, wherein a first electrode of the fourteenth transistor is coupled to the pull-down node, and wherein a second electrode of the fourteenth transistor is coupled to the fifth voltage terminal to receive the fifth voltage.

14. The shift register unit according to claim 8, further comprising a display reset circuit and a global reset circuit, wherein the display reset circuit is configured to reset the pull-up node in response to a display reset signal; and wherein the global reset circuit is configured to reset the pull-up node in response to a global reset signal.

15. The shift register unit according to claim 14, wherein the display reset circuit comprises a fifteenth transistor, and wherein the global reset circuit comprises a sixteenth transistor;

wherein a control electrode of the fifteenth transistor is coupled to a display reset signal terminal to receive the display reset signal, wherein a first electrode of the fifteenth transistor is coupled to the pull-up node, and wherein a second electrode of the fifteenth transistor is coupled to a fifth voltage terminal to receive a fifth voltage; and wherein a control electrode of the sixteenth transistor is coupled to a global reset signal terminal to receive the global reset signal, wherein a first electrode of the sixteenth transistor is coupled to the pull-up node, and wherein a second electrode of the sixteenth transistor is coupled to the fifth voltage terminal to receive the fifth voltage.

16. A gate driving circuit comprising a plurality of cascaded shift register units according to claim 1.

17. The gate driving circuit according to claim 16, wherein an Mth-stage shift register unit outputs pixel signals for pixel units of a 2M−1th row and pixel signals for pixel units of a 2Mth row;

wherein a shift signal output terminal of the Mth-stage shift register unit is coupled to a display input signal terminal of an M+1th-stage shift register unit;

wherein a display reset signal terminal of the Mth-stage shift register unit is coupled to a shift signal output terminal of an M+2th stage shift register unit; and wherein M is an integer greater than zero.

18. A display device comprising a gate driving circuit according to claim 16.

19. A driving method of a shift register unit according to claim 1, the method comprising:

in a display period of a frame, outputting the shift signal to another shift register unit through the shift signal output terminal; and in a display period of a frame, outputting a plurality of pixel signals respectively to a plurality of rows of pixel units through the plurality of pixel signal output terminals, wherein the plurality of pixel signals comprise a plurality of display output signals.

20. The driving method of a shift register unit according to claim 19, wherein in a display period of a frame, the plurality of pixel clock signals are respectively inputted into the plurality of pixel signal output sub-circuits based on a display timing of the plurality of rows of pixel units;

wherein the display timing is a row scan display timing that causes each row of the plurality of rows of pixel units to be displayed in sequence; and wherein in a display period of a frame, the plurality of pixel signal output sub-circuits respectively output the plurality of pixel clock signals to the plurality of pixel signal output terminals under the control of the plurality of pixel clock signals, as the plurality of display output signals.

* * * * *

UNITED STATES PATENT AND TRADEMARK OFFICE
CERTIFICATE OF CORRECTION

PATENT NO. : 11,244,619 B2
APPLICATION NO. : 16/643280
DATED : February 8, 2022
INVENTOR(S) : Xuehuan Feng et al.

It is certified that error appears in the above-identified patent and that said Letters Patent is hereby corrected as shown below:

In the Specification

Column 15, Lines 44-51, delete "Specifically, when the first pixel clock signal CLKO1 is at a high level, the sixth transistor M6_1 of the first pixel signal output sub-circuit 3001 communicates it to the first pixel signal output terminal OUT1, and when the second pixel clock signal CLKO2 is at a high level, the sixth transistor M6_2 of the second pixel signal output sub-circuit 3002 communicates it to the first pixel signal output terminal OUT2.".
Column 20, Line 62, delete "first transistor M" and insert therefor -- first transistor M1 --.

Signed and Sealed this
Twenty-eighth Day of June, 2022

Katherine Kelly Vidal
Director of the United States Patent and Trademark Office